United States Patent
Yang et al.

(10) Patent No.: US 8,206,597 B2
(45) Date of Patent: Jun. 26, 2012

(54) PROTECTED ALLOY SURFACES IN MICROCHANNEL APPARATUS AND CATALYSTS, ALUMINA SUPPORTED CATALYSTS, CATALYST INTERMEDIATES, AND METHODS OF FORMING CATALYSTS AND MICROCHANNEL APPARATUS

(75) Inventors: Barry L. Yang, Dublin, OH (US); Anna Lee Tonkovich, Dublin, OH (US); Junko M. Watson, Columbus, OH (US); Francis P. Daly, Delaware, OH (US); Sean P. Fitzgerald, Columbus, OH (US); Chunshe Cao, Kennewick, WA (US); Xiaohong Li, Richland, WA (US); Terry Mazanec, Solon, OH (US); Bradley R. Johnson, Richland, WA (US); Ravi Arora, Dublin, OH (US); David J. Hesse, Columbus, OH (US); Dongming Qiu, Bothell, WA (US); Rachid Taha, Dublin, OH (US); Jeffrey J. Ramler, Lewis Center, OH (US); Yong Wang, Richland, WA (US); Richard Long, New Albany, OH (US); Ya-Huei Chin, Richland, WA (US)

(73) Assignee: Velocys, Inc., Plain City, OH (US)

( * ) Notice: Subject to any disclaimer, the term of this patent is extended or adjusted under 35 U.S.C. 154(b) by 0 days.

(21) Appl. No.: 13/012,797

(22) Filed: Jan. 24, 2011

(65) Prior Publication Data
US 2011/0182804 A1    Jul. 28, 2011

Related U.S. Application Data

(62) Division of application No. 11/088,685, filed on Mar. 23, 2005, now Pat. No. 7,874,432.

(60) Provisional application No. 60/556,014, filed on Mar. 23, 2004.

(51) Int. Cl.
*B01D 37/00* (2006.01)
*B01D 39/00* (2006.01)
*B01J 8/00* (2006.01)

(52) U.S. Cl. ............... 210/767; 210/500.25; 210/490; 422/603; 422/211; 585/924; 585/920; 55/523; 55/524

(58) Field of Classification Search ............ 210/500.25, 210/510.2, 490, 767; 427/237, 239, 250; 264/42, 45.1, 603; 422/130, 603, 211; 96/10; 585/924, 920; 55/523, 524
See application file for complete search history.

(56) References Cited

U.S. PATENT DOCUMENTS

| | | | |
|---|---|---|---|
| 4,021,373 A | | 5/1977 | Kane |
| 4,935,139 A * | | 6/1990 | Davidson et al. ............ 210/490 |
| 5,202,303 A | | 4/1993 | Retallick et al. |
| 5,259,754 A | | 11/1993 | Dalla Betta et al. |
| 5,308,457 A | | 5/1994 | Dalla Betta et al. |
| 5,605,628 A * | | 2/1997 | Davidson et al. ........ 210/321.83 |
| 5,877,107 A | | 3/1999 | Zahn et al. |
| 5,899,679 A | | 5/1999 | Euzen et al. |
| 5,928,725 A * | | 7/1999 | Howard et al. ............... 427/237 |
| 6,117,578 A | | 9/2000 | Lesieur et al. |
| 6,508,862 B1 | | 1/2003 | Tonkovich et al. |
| 6,613,383 B1 * | | 9/2003 | George et al. ................. 427/212 |
| 6,899,744 B2 * | | 5/2005 | Mundschau ...................... 95/56 |
| 7,001,446 B2 * | | 2/2006 | Roark et al. ....................... 95/56 |
| 7,306,642 B2 * | | 12/2007 | Hayward et al. ............... 55/523 |
| 2002/0031471 A1 | | 3/2002 | Tonkovich et al. |

* cited by examiner

*Primary Examiner* — Ana Fortuna
(74) *Attorney, Agent, or Firm* — Frank Rosenberg

(57) ABSTRACT

The invention describes microchannel apparatus and catalysts that contain a layer of a metal aluminide or are made in a process in which a metal aluminide layer is formed as an intermediate. Certain processing conditions have surprisingly been found to result in superior coatings. The invention includes chemical processes conducted through apparatus described in the specification. Other catalysts and catalyst synthesis techniques are also described.

17 Claims, 14 Drawing Sheets

US 8,206,597 B2

PROTECTED ALLOY SURFACES IN MICROCHANNEL APPARATUS AND CATALYSTS, ALUMINA SUPPORTED CATALYSTS, CATALYST INTERMEDIATES, AND METHODS OF FORMING CATALYSTS AND MICROCHANNEL APPARATUS

RELATED APPLICATIONS

This application is a divisional of U.S. patent application Ser. No. 11/088,685 filed Mar. 23, 2005, now U.S. Pat. No. 7,874,432. In accordance with 35 U.S.C. sect. 119(e), this application claims priority to U.S. Provisional Application No. 60/556,014, filed Mar. 23, 2004.

FIELD OF THE INVENTION

This invention relates to microchannel apparatus, catalysts and methods of making same. The invention also relates to chemical reactions and microchannel chemical reactors.

INTRODUCTION

In recent years there has been tremendous academic and commercial interest in microchannel devices. This interest has arisen due to the advantages from microtechnology including reduced size, increased productivity, the ability to size systems of any desired capacity (i.e., "number-up"), increased heat transfer, and increased mass transfer. A review of some of the work involving microreactors (a subset of microchannel apparatus) has been provided by Gavrilidis et al., "Technology And Applications Of Microengineered Reactors," Trans. IChemE, Vol. 80, Part A, pp. 3-30 (January 2002).

Microchannel apparatus can be made of a variety of materials including ceramics, plastics, and metals. In many applications, process channels in microchannel apparatus require a coating or coatings over the structural material. The coatings can serve purposes such as absorption, adsorption, corrosion protection, surface wettability for tailored micro-fluidics and catalysis. In some cases, microchannels are slurry coated or sol coated; for example, an oxide coat applied to a ceramic honeycomb. In some cases, sheets of a material are coated and then assembled and bonded to form a multilayer microchannel device.

Since one focus of the present invention includes aluminide coatings, reference can be made to early work described by LaCroix in U.S. Pat. No. 3,944,505. This patent describes a catalytic device made of a stack of expanded metal sheets (such as Inconel). The metal sheets carry a layer of a nickel or cobalt aluminide and a layer of alpha alumina on the aluminide, and a catalytic surface on the aluminide. LaCroix did not describe how the aluminide layer was formed on the sheets, nor did LaCroix provide any data describing the aluminide layer.

Methods of forming aluminide coatings are well known and have been utilized commercially for coating certain jet engine parts. Methods of making aluminide coatings from aluminum halides are described in, for example, U.S. Pat. Nos. 3,486,927 and 6,332,926.

There have been attempts to apply aluminide coatings on interior channels of gas turbine airfoils. Rigney et al. in U.S. Pat. No. 6,283,714 reported coating internal cooling passages of turbine blades with an aluminum coating using a slurry/pack process. Rigney et al. also stated that an aluminum halide gas could be passed through the cooling passages at high temperature so that an aluminum coating about 0.002 inch (50 μm) thick may be deposited in about 4 to 8 hours. Pfaendter et al. in U.S. Pat. No. 6,332,926 also suggests flowing an aluminum-coating precursor to deposit aluminum onto an internal airfoil surface.

Howard et al. in U.S. Pat. No. 5,928,725 entitled "Method and Apparatus for Gas Phase Coating Complex Internal Surfaces of Hollow Articles," reviewed prior art methods of gas phase coating for coating internal surfaces but remarked that the prior art methods were ineffective for coating multiple gas passages of modern airfoils and result in non-uniform internal coatings. In the process described in this patent, the coating gas flow rate is controlled to a different rate into at least two channels. Howard et al. state that a coating mixture including aluminum powder, aluminum oxide and aluminum fluoride could be heated to deliver a coating gas. This improved method was reported to result in an aluminide coating thickness of 1.5 mils±1.0 mil.

As described below, the present invention provides novel microchannel apparatus having improved coatings and methods of making improved coatings. The invention also includes methods of conducting unit operations through microchannel devices with coated microchannels.

SUMMARY OF THE INVENTION

In a first aspect, the invention provides a microchannel reactor or separator, comprising: a complex microchannel defined by at least one microchannel wall; and a layer of aluminide disposed over the at least one microchannel wall. In this aspect as well as the next aspect, it is important to recognize the character of the invention as a reactor or separator—these functions are integral to the definition of the invention. Preferably the reactor or separator further comprises a layer of alumina disposed over the layer of aluminide; and a catalytic material disposed over the layer of alumina. The reactor or separator may include a manifold that is connected to at least two microchannels, wherein the manifold comprises a manifold wall that is coated with an aluminide layer. In a preferred embodiment, the reactor or separator is made by laminating together sheets and the layer of aluminide is a post-assembly coating. As with all aspects of the invention, the invention can be further described in conjunction with any details from the Detailed Description. Furthermore, as with all aspects of the invention, the invention includes methods of making the apparatus and methods of conducting a chemical process in the apparatus. For example, the invention includes a method of conducting a chemical reaction or separating a mixture comprising at least two components in the above-described reactor or separator, comprising either:

(a) wherein the reactor or separator is a reactor and the reactor further comprises a layer of alumina disposed over the layer of aluminide; and a catalytic material disposed over the layer of alumina, and comprising a step of passing a reactant into the complex microchannel and reacting the reactant in the complex microchannel to form at least one product; or (b) wherein the reactor or separator is a separator and comprising a step of passing a fluid comprising at least two components into the complex microchannel, preferentially separating at least one of the at least two components within the complex microchannel.

In another aspect, the invention provides a microchannel reactor or separator, comprising: a microchannel defined by at least one microchannel wall; and a post-assembly coating of aluminide disposed over the at least one microchannel wall. Preferably, the microchannel reactor or separator, further comprises a layer alumina disposed over the layer of aluminide; and a catalytic material disposed over the layer of alumina. Again, by way of example, the invention includes methods of making the apparatus (such as by applying a post-assembly coating) and a method of conducting a chemical reaction or separating a mixture comprising at least two components in the above-described reactor or separator, comprising either:

(a) wherein the reactor or separator is a reactor and the reactor further comprises a layer of alumina disposed over the post-assembly layer of aluminide; and a catalytic material disposed over the layer of alumina, and comprising a step of passing a reactant into the complex microchannel and reacting the reactant in the complex microchannel to form at least one product; or (b) wherein the reactor or separator is a separator and comprising a step of passing a fluid comprising at least two components into the microchannel, preferentially separating at least one of the at least two components within the complex microchannel.

In a further aspect, the invention provides a catalyst or catalyst precursor, comprising: a substrate; an aluminide coating disposed over the substrate; an alumina layer disposed over the aluminide coating, wherein the alumina layer comprises at least 0.1 wt % of a rare earth element or sintering aid; and a catalyst material disposed on the alumina layer. Likewise, the invention includes a method of making this catalyst or catalyst precursor and methods of conducting chemical reactions over the catalyst. It may be observed that a "substrate" can be any catalyst support including a microchannel wall such as in a microchannel reactor.

In another aspect, the invention provides a method of making a catalyst, comprising: depositing aluminide on a substrate; oxidizing the surface of the aluminide layer to form alumina needles; and depositing a catalyst material onto the alumina needles.

In yet another aspect, the invention provides a method of making a coated structure, comprising: depositing aluminide on a substrate; exposing the aluminide to an oxidizing agent to form an alumina layer; depositing a sintering aid on the alumina layer to form an article with an alumina layer with sintering aid; and heating the article with an alumina layer with sintering aid.

In a further aspect, the invention provides a method of forming a catalyst, comprising: adding a sintering aid to alumina to form an article with an alumina layer with sintering aid; and heating the article with an alumina layer with sintering aid; and subsequently depositing a catalyst material.

In another aspect, the invention provides a method of forming a microchannel reactor comprising any of the above methods of forming a catalyst. For example, coatings can be applied to a microchannel wall or to an insert that is added to or disposed in a reaction microchannel.

In a further aspect, the invention provides microchannel apparatus, comprising: at least two parallel microchannels, each of which is contiguous for at least 1 cm; a manifold connecting the at least two microchannels; wherein the manifold comprises an aluminide coating.

In another aspect, the invention provides a method of forming protected surfaces, comprising: providing an article comprising an aluminide surface; heating the article comprising an aluminide surface to at least about 800° C. in an inert or reducing atmosphere; and exposing the aluminde surface to an oxidizing gas at a temperature of at least about 800° C., preferably at least about 1000° C. and more preferably in the range of about 1000 to 1100° C., to grow an oxide layer.

In still another aspect, the invention provides a method of making microchannel apparatus, comprising: placing an insert into an interior microchannel; and forming an aluminide inside the channel and creating a metallic bond between the insert and a microchannel wall.

Many aspects of the present invention include passage of gaseous aluminum compounds over metal surfaces (especially a metal wall of a microchannel) and simultaneously or subsequently reacting with a metal in the substrate to form a surface layer of metal aluminide—this process is termed aluminization, perhaps more accurately, aluminidization. Conditions for aluminidization are conventionally known for jet engine parts, and the conventional steps are not described here. Certain steps such as excluding oxygen, controlling flow, and passage through manifolds are discussed in greater detail below.

In one aspect, the invention provides a method of forming a catalyst that comprises the steps of: (1) depositing a layer of Al, (2) forming a layer of metal aluminide on a metal alloy; (3) oxidizing the metal aluminide to form an alumina scale (in some embodiments this scale is in the form of alumina needles); (4) optionally modifying the scale (a) by an acid or base etch, and/or adding a rare earth salt to form a rare earth-modified alumina, and/or (c) adding sintering aids; (5) optionally coating with a metal oxide sol (or metal oxide slurry); and (6) adding a catalyst metal (typically by impregnation). Preferably the metal oxide sol or slurry is an alumina sol (here, alumina sol means a sol that after being deposited and heated, forms alumina) or alumina slurry. The invention also includes each of the individual steps or any combination thereof. For example, steps (1) and (2), deposition of Al and formation of a metal aluminide can be accomplished in a single step. As another example, in one preferred aspect, the invention comprises a method of forming a catalyst comprising a step of adding sintering aids onto an alumina support (which may be pellets or an alumina layer on a substrate). In another example, steps (5) and (6), coating with a catalyst precursor sol, and addition of a catalyst metal, can be incorporated into a single step. In another embodiment the metal alloy can be pre-coated with a catalytically active metal before the deposition of the surface aluminum layer in step (1). The invention also includes the catalysts and catalyst intermediates formed by the disclosed methods. The invention further includes microchannel apparatus that is treated by any of the inventive methods; for example, the invention includes microchannel apparatus that comprises a layer of a nickel aluminide, or an apparatus that is made by oxidizing a nickel aluminide followed by applying an alumina wash coat. The invention also includes the optional coating of pipes, tubes, or other structures attached to the microchannel reactor.

The invention also includes methods for catalytic chemical conversion, such method comprising flowing a reactant fluid composition into a microchannel, wherein a catalyst composition is present in the microchannel (on a microchannel wall or elsewhere within the microchannel), and reacting the reactant fluid composition to form a desired product (or products) in the microchannel. The invention further includes methods for catalytic chemical conversion comprising contacting at least one reactant with an inventive catalyst.

Various embodiments of the invention can provide various advantages. An aluminide layer serves as an aluminum reservoir for self healing if there is any damage to the overlying alumina layer. The aluminide layer may also reduce coke formation (in processes susceptible to coke formation) and reduce metal dusting. The corrosive power of a chemical reaction often depends on both the temperature and the chemical nature of the fluid to be processed. Alumina is both thermally and chemically stable, and thus superior to many other materials.

GLOSSARY OF TERMS USED

"Metal aluminide" refers to a metallic material containing 10% or more Metal and 5%, more preferably 10%, or greater Aluminum (Al) with the sum of Metal and Al being 50% or more. These percentages refer to mass percents. Preferably, a metal aluminide contains 50% or more Metal and 10% or greater Al with the sum of Ni and Al being 80% or more. In embodiments in which Metal and Al have undergone significant thermal diffusion, it is expected that the composition of a Metal-Al layer will vary gradually as a function of thickness so that there may not be a distinct line separating the Metal-Al layer from an underlying Metal-containing alloy substrate. The term "aluminide" is used synonymously with metal aluminide. A phase diagram of the NiAl system is shown in FIG. 2 of U.S. Pat. No. 5,716,720.

A preferred metal aluminide is nickel aluminide (NiAl). "Nickel aluminide" refers to a material containing 10% or more Ni and 10% or greater Al with the sum of Ni and Al being 50% or more. These percentages refer to mass percents. Preferably, a nickel aluminide contains 20% or more Ni and 10% or greater Al with the sum of Ni and Al being 80% or more. In embodiments in which Ni and Al have undergone significant thermal diffusion, it is expected that the composition of a Ni—Al layer will vary gradually as a function of thickness so that there may not be a distinct line separating the Ni—Al layer from an underlying Ni-based alloy substrate.

A "catalyst material" is a material that catalyzes a desired reaction. It is not alumina. A catalyst material "disposed over" a layer can be a physically separate layer (such as a sol-deposited layer) or a catalyst material disposed within a porous, catalyst support layer. "Disposed onto" or "disposed over" mean directly on or indirectly on with intervening layers. In some preferred embodiments, the catalyst material is directly on a thermally-grown alumina layer.

A "catalyst metal" is the preferred catalyst material and is a material in metallic form that catalyzes a desired reaction. Catalyst metals can exist as fully reduced metals, or as mixtures of metal and metal oxides, depending on the conditions of treatment. Particularly preferred catalyst metals are Pd, Rh and Pt.

A "complex microchannel" is in apparatus that includes one or more of the following characteristics: at least one contiguous microchannel has a turn of at least 45°, in some embodiments at least 90°, in some embodiments a u-bend; a length of 50 cm or more, or a length of 20 cm or more along with a dimension of 2 mm or less, and in some embodiments a length of 50-500 cm; at least one microchannel that splits into at least 2 sub-microchannels in parallel, in some embodiments 2 to 4 sub-channels in parallel; at least 2 adjacent channels, having an adjacent length of at least one cm that are connected by plural orifices along a common microchannel wall where the area of orifices amounts to 20% or less of the area of the microchannel wall in which the orifices are located and where each orifice is 1.0 mm$^2$ or smaller, in some embodiments 0.6 mm$^2$ or smaller, in some embodiments 0.1 mm$^2$ or smaller—this is a particularly challenging configuration because a coating should be applied without clogging the holes; or at least two, in some embodiments at least 5, parallel microchannels having a length of at least 1 cm, have openings to an integral manifold, where the manifold includes at least one dimension that is no more than three times the minimum dimension of the parallel microchannels (for example, if one of the parallel microchannels had a height of 1 mm (as the smallest dimension in the set of parallel microchannels), then the manifold would possess a height of no more than 3 mm). An integral manifold is part of the assembled device and is not a connecting tube. A complex microchannel is one type of interior microchannel.

A "contiguous microchannel" is a microchannel enclosed by a microchannel wall or walls without substantial breaks or openings—meaning that openings (if present) amount to no more than 20% (in some embodiments no more than 5%, and in some embodiments without any openings) of the area of the microchannel wall or walls on which the opening(s) are present.

An "interior microchannel" is a microchannel within a device that is surrounded on all sides by a microchannel wall or walls except for inlets and outlets, and, optionally, connecting holes along the length of a microchannel such as a porous partition or orifices such as connecting orifices between a fuel channel and an oxidant channel. Since it is surrounded by walls, it is not accessible by conventional lithography, conventional physical vapor deposition, or other surface coating techniques with line-of-sight limitation.

An "insert" is a component that can be inserted into a channel either before or after assembly of the apparatus.

A "manifold" is a header or footer that connects plural microchannels and is integral with the apparatus.

"Ni-based" alloys are those alloys comprising at least 30%, preferably at least 45% Ni, more preferably at least 50% (by mass). In some preferred embodiments, these alloys also contain at least 5%, preferably at least 10% Cr.

A "post-assembly" coating is applied onto three dimensional microchannel apparatus. This is either after a laminating step in a multilayer device made by laminating sheets or after manufacture of a manufactured multi-level apparatus such as an apparatus in which microchannels are drilled into a block. This "post-assembly" coating can be contrasted with apparatus made by processes in which sheets are coated and then assembled and bonded or apparatus made by coating a sheet and then expanding the sheet to make a three-dimensional structure. For example, a coated sheet that is then expanded may have uncoated slit edges. Uncoated surfaces of all types, such as slit edges, can undergo corrosion or reaction under reaction conditions. Thus, it is advantageous to coat the device after assembly to protect all of the internal surface against corrosion. The post-assembly coating provides advantages such as crack-filling and ease of manufacture. Additionally, the aluminide or other coating could interfere with diffusion bonding of a stack of coated sheets and result in an inferior bond since aluminide is not an ideal material for bonding a laminated device and may not satisfy mechanical requirements at high temperature. Whether an apparatus is made by a post-assembly coating is detectable by observable characteristics such as gap-filling, crack-filling, elemental analysis (for example, elemental composition of sheet surfaces versus bonded areas) Typically, these characterisitics are observed by optical microscopy, electron microscopy or electron microscopy in conjunction with elemental analysis. Thus, for a given apparatus, there is a difference between pre-assembled and post-assembled coated devices, and an analysis using well-known analytical techniques can establish whether a coating was applied before or after assembly (or manufacture in the case of drilled microchannels) of the microchannel device.

A "separator" is a type of chemical processing apparatus that is capable of separating a component or components from a fluid. For example, a device containing an adsorbent, distillation or reactive distillation apparatus, etc.

DESCRIPTION OF THE INVENTION

Microchannel Apparatus

Microchannel reactors are characterized by the presence of at least one reaction channel having at least one dimension (wall-to-wall, not counting catalyst) of 1.0 cm or less, preferably 2.0 mm or less (in some embodiments about 1.0 mm or less) and greater than 100 nm (preferably greater than 1 μm), and in some embodiments 50 to 500 μm. A reaction channel is a channel containing a catalyst. Microchannel apparatus is similarly characterized, except that a catalyst-containing reaction channel is not required. Both height and width are substantially perpendicular to the direction of flow of reactants through the reactor. Microchannels are also defined by the presence of at least one inlet that is distinct from at least one outlet—microchannels are not merely channels through zeolites or mesoporous materials. The height and/or width of a reaction microchannel is preferably about 2 mm or less, and more preferably 1 mm or less. The length of a reaction channel is typically longer. Preferably, the length of a reaction channel is greater than 1 cm, in some embodiments greater than 50 cm, in some embodiments greater than 20 cm, and in some embodiments in the range of 1 to 100 cm. The sides of a microchannel are defined by reaction channel walls. These walls are preferably made of a hard material such as a ceramic, an iron based alloy such as steel, or a Ni-, Co- or Fe-based superalloy such as monel. The choice of material for the walls of the reaction channel may depend on the reaction for which the reactor is intended. In some embodiments, the reaction chamber walls are comprised of a stainless steel or Inconel® which is durable and has good thermal conductivity. The alloys should be low in sulfer, and in some embodiments are subjected to a desulferization treatment prior to formation of an aluminide. Typically, reaction channel walls are formed of the material that provides the primary structural support for the microchannel apparatus. The microchannel apparatus can be made by known methods (except for the coatings and treatments described herein), and in some preferred embodiments are made by laminating interleaved plates (also known as "shims"), and preferably where shims designed for reaction channels are interleaved with shims designed for heat exchange. Of course, as is conventionally known, "reactors" or "separators" do not include jet engine parts. In preferred embodiments, microchannel apparatus does not include jet engine parts. Some microchannel apparatus includes at least 10 layers laminated in a device, where each of these layers contain at least 10 channels; the device may contain other layers with fewer channels.

Figure 1:
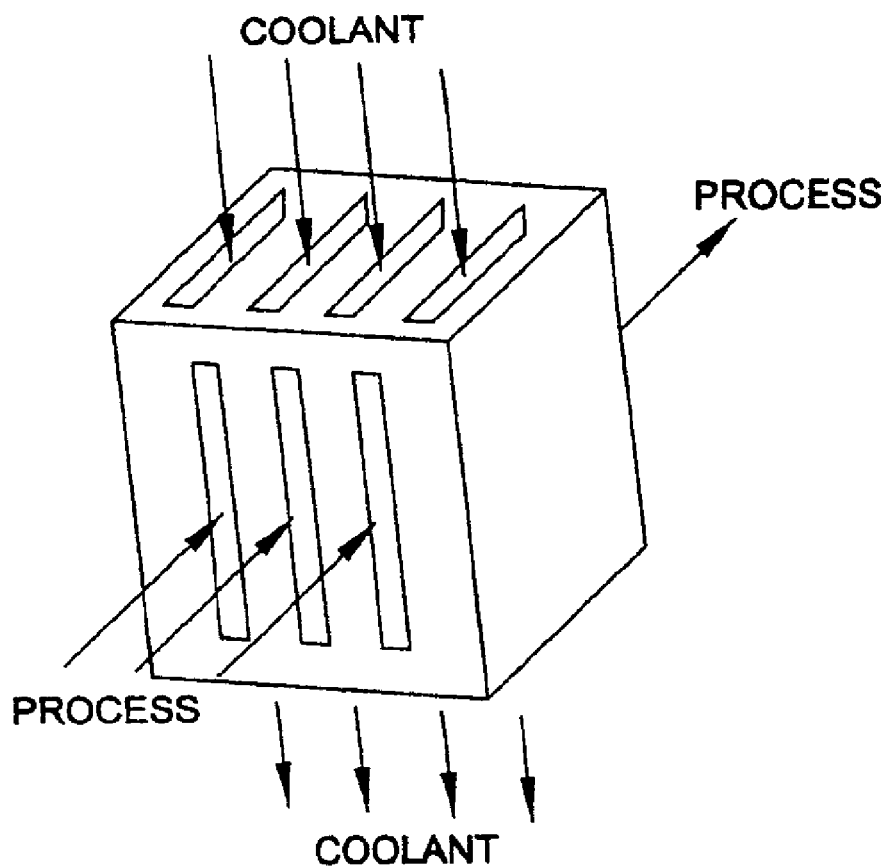
FIG. 1 is a simplified view of a microreactor with a set of reaction microchannels in a cross-flow relationship with a set of cooling microchannels.

FIG. 1 is a schematic and simplified view of one embodiment of a microchannel reactor in which reactant feed passes through a reaction microchannel (bottom) while coolant (in a cross-flow arrangement) flows through an adjacent heat exchanger (top). Microchannel reactors preferably include a plurality of microchannel reaction channels and a plurality of adjacent heat exchange microchannels. The plurality of microchannel reaction channels may contain, for example, 2, 10, 100, 1000 or more channels. In preferred embodiments, the microchannels are arranged in parallel arrays of planar microchannels, for example, at least 3 arrays of planar microchannels. In some preferred embodiments, multiple microchannel inlets are connected to a common header and/or multiple microchannel outlets are connected to a common footer. During operation, the heat exchange microchannels (if present) contain flowing heating and/or cooling fluids. Non-limiting examples of this type of known reactor usable in the present invention include those of the microcomponent sheet architecture variety (for example, a laminate with microchannels) exemplified in U.S. Pat. Nos. 6,200,536 and 6,219,973 (both of which are hereby incorporated by reference). Performance advantages in the use of this type of reactor architecture for the purposes of the present invention include their relatively large heat and mass transfer rates, and the substantial absence of any explosive limits. Microchannel reactors can combine the benefits of good heat and mass transfer, excellent control of temperature, residence time and minimization of by-products. Pressure drops can be low, allowing high throughput and the catalyst can be fixed in a very accessible form within the channels eliminating the need for separation. Furthermore, use of microchannel reactors can achieve better temperature control, and maintain a relatively more isothermal profile, compared to conventional systems. In some embodiments, the reaction microchannel (or microchannels) contains a bulk flow path. The term "bulk flow path" refers to an open path (contiguous bulk flow region) within the reaction chamber. A contiguous bulk flow region allows rapid fluid flow through the reaction chamber without large pressure drops. In some preferred embodiments there is laminar flow in the bulk flow region. Bulk flow regions within each reaction channel preferably have a cross-sectional area of $5 \times 10^{-8}$ to $1 \times 10^{-2}$ m$^2$, more preferably $5 \times 10^{-7}$ to $1 \times 10^{-4}$ m$^2$. The bulk flow regions preferably comprise at least 5%, more preferably at least 50% and in some embodiments, 30-80% of either 1) the internal volume of the reaction chamber, or 2) a cross-section of the reaction channel.

In many preferred embodiments, the microchannel apparatus contains multiple microchannels, preferably groups of at least 5, more preferably at least 10, parallel channels that are connected in a common manifold that is integral to the device (not a subsequently-attached tube) where the common manifold includes a feature or features that tend to equalize flow through the channels connected to the manifold. Examples of such manifolds are described in U.S. patent application Ser. No. 10/695,400, filed Oct. 27, 2003 which is incorporated herein as if reproduced in full below. In this context, "parallel" does not necessarily mean straight, rather that the channels conform to each other. In some preferred embodiments, a microchannel device includes at least three groups of parallel microchannels wherein the channel within each group is connected to a common manifold (for example, 4 groups of microchannels and 4 manifolds) and preferably where each common manifold includes a feature or features that tend to equalize flow through the channels connected to the manifold. An aluminide coating can be formed in a group of connected microchannels by passing an aluminum-containing gas into a manifold, typically, the manifold will also be coated.

Heat exchange fluids may flow through heat transfer microchannels adjacent to process channels (preferably reaction microchannels), and can be gases or liquids and may include steam, liquid metals, or any other known heat exchange fluids—the system can be optimized to have a phase change in the heat exchanger. In some preferred embodiments, multiple heat exchange layers are interleaved with multiple reaction microchannels. For example, at least 10 heat exchangers interleaved with at least 10 reaction microchannels and preferably there are 10 layers of heat exchange microchannel arrays interfaced with at least 10 layers of reaction microchannels. Each of these layers may contain simple, straight channels or channels within a layer may have more complex geometries.

While simple microchannels can be utilized, the invention has particularly strong advantages for apparatus with complex microchannel geometries. In some preferred embodiments, the microchannel apparatus includes one or more of the following characteristics: at least one contiguous microchannel has a turn of at least 45°, in some embodiments at least 90°, in some embodiments a u-bend; a length of 50 cm or more, or a length of 20 cm or more along with a dimension of 2 mm or less, and in some embodiments a length of 50-200 cm; at least one microchannel that splits into at least 2 sub-microchannels in parallel, in some embodiments 2 to 4 sub-channels in parallel; at least 2 adjacent channels, having an adjacent length of at least one cm that are connected by plural orifices along a common microchannel wall where the area of orifices amounts to 20% or less of the area of the microchannel wall in which the orifices are located and where each orifice is 1.0 mm$^2$ or smaller, in some embodiments 0.6 mm$^2$ or smaller, in some embodiments 0.1 mm$^2$ or smaller—this is a particularly challenging configuration because a coating should be applied without clogging the holes; or at least two, in some embodiments at least 5, parallel microchannels having a length of at least 1 cm, have openings to an integral manifold, where the manifold includes at least one dimension that is no more than three times the minimum dimension of the parallel microchannels (for example, if one of the parallel microchannels had a height of 1 mm (as the smallest dimension in the set of parallel microchannels), then the manifold would possess a height of no more than 3 mm). An integral manifold is part of the assembled device and is not a connecting tube. A complex microchannel is one type of interior microchannel. In some apparatus, a microchannel contains a u-bend which means that, during operation, flow (or at least a portion of the flow) passes in opposite directions within a device and within a contiguous channel (note that a contiguous channel with a u-bend includes split flows such as a w-bend, although in some preferred embodiments all flow within a microchannel passes through the u-bend and in the opposite direction in a single microchannel).

In some embodiments, the inventive apparatus (or method) includes a catalyst material. The catalyst may define at least a portion of at least one wall of a bulk flow path. In some preferred embodiments, the surface of the catalyst defines at least one wall of a bulk flow path through which the mixture passes. During operation, a reactant composition flows through the microchannel, past and in contact with the catalyst. In some preferred embodiments, a catalyst is provided as an insert that can be inserted into (or removed from) each channel in a single piece; of course the insert would need to be sized to fit within the microchannel. In some embodiments, the height and width of a microchannel defines a cross-sectional area, and this cross-sectional area comprises a porous catalyst material and an open area, where the porous catalyst material occupies 5% to 95% of the cross-sectional area and where the open area occupies 5% to 95% of the cross-sectional area. In some embodiments, the open area in the cross-sectional area occupies a contiguous area of $5 \times 10^{-8}$ to $1 \times 10^{-2}$ m$^2$. In some embodiments, a porous catalyst (not including void spaces within the catalyst) occupies at least 60%, in some embodiments at least 90%, of a cross-sectional area of a microchannel. Alternatively, catalyst can substantially fill the cross-sectional area of a microchannel (a flow through configuration). In another alternative, catalyst can be provided as a coating (such as a washcoat) of material within a microchannel reaction channel or channels. The use of a flow-by catalyst configuration can create an advantageous capacity/pressure drop relationship. In a flow-by catalyst configuration, fluid preferably flows in a gap adjacent to a porous insert or past a wall coating of catalyst that contacts the microchannel wall (preferably the microchannel wall that contacts the catalyst is in direct thermal contact with a heat exchanger (preferably a microchannel heat exchanger), and in some embodiments a coolant or heating stream contacts the opposite side of the wall that contacts the catalyst).

Other Substrates

In preferred embodiments, the inventive apparatus, catalysts or methods contain or use an aluminide coating on an interior microchannel. In preferred embodiments, the invention includes an aluminide layer, an alumina layer and a catalyst material coated onto an interior microchannel wall. However, in some embodiments, the aluminide-coated microchannel contains a "porous catalyst material" as described below. For example, a porous catalyst material such as a porous metal foam could be coated with an aluminide layer to form a catalyst. In other embodiments, the invention includes a catalyst (or method of making a catalyst) in which an aluminide layer is formed on a substrate (catalyst support) other than a microchannel wall. Thus, in some embodiments, the invention includes a substrate, an aluminide coating over the substrate, and a catalyst material over the aluminide (preferably with an intervening alumina layer)—the substrate may have a conventional form such as pellets or rings; in some embodiments the substrate is not an expanded metal sheet. As in the case of microchannel walls, preferred catalyst supports are preferably formed of a Ni-, Co-, or Fe-based superalloy.

A "porous catalyst material" (or "porous catalyst") refers to a porous material (that may be an insert) having a pore volume of 5 to 98%, more preferably 30 to 95% of the total porous material's volume. At least 20% (more preferably at least 50%) of the material's pore volume is composed of pores in the size (diameter) range of 0.1 to 300 microns, more preferably 0.3 to 200 microns, and still more preferably 1 to 100 microns. Pore volume and pore size distribution are measured by Mercury porisimetry (assuming cylindrical geometry of the pores) and nitrogen adsorption. As is known, mercury porisimetry and nitrogen adsorption are complementary techniques with mercury porisimetry being more accurate for measuring large pore sizes (larger than 30 nm) and nitrogen adsorption more accurate for small pores (less than 50 nm). Pore sizes in the range of about 0.1 to 300 microns enable molecules to diffuse molecularly through the materials under most gas phase catalysis conditions. The porous material can itself be a catalyst, but more preferably the porous material comprises a metal, ceramic or composite support having a layer or layers of a catalyst material or materials deposited thereon. The porosity can be geometrically regular as in a honeycomb or parallel pore structure, or porosity may be geometrically tortuous or random. Preferably, a large pore support is a foam metal or foam ceramic. The catalyst layers, if present, are preferably also porous. The average pore size (volume average) of the catalyst layer(s) is preferably smaller than the average pore size of the support. The average pore sizes in the catalyst layer(s) disposed upon the support preferably ranges from $10^{-9}$ m to $10^{-7}$ m as measured by $N_2$ adsorption with BET method. More preferably, at least 50 volume % of the total pore volume is composed of pores in the size range of $10^{-9}$ m to $10^{-7}$ m in diameter.

Metal Aluminide Layer

In some embodiments of the invention, at least a portion of at least one interior wall of a microchannel apparatus (preferably a microreactor) is coated with a layer of a metal aluminide (preferably nickel aluminide (NiAl)). It has been surprisingly discovered that an alumina wall coating formed by oxidizing a metal aluminide (NiAl in the examples) coating provides superior corrosion resistance as compared to either thermally grown oxide layer (grown from the substrate without forming an aluminide) or a solution deposited alumina layer. It is believed that exceptionally uniform coatings result from solid state reaction of aluminum deposited at the surface from the gas phase and nickel diffusing out from the substrate towards the surface. In addition, nickel may be plated onto a metal that is not rich in nickel, such as stainless steel, to create a reactive surface for the aluminidization process. Nickel aluminide could also be deposited by supplying both Al and Ni precursors in the vapor phase concurrently or as a mixture. In a related aspect, a catalyst or catalyst intermediate is formed on substrates having such a nickel aluminide surface. Of course, the invention also includes methods of making catalysts or microchannel apparatus comprising coating a substrate (preferably a Ni-based alloy) with chemical vapor deposited aluminum that is simultaneously and/or subsequently converted to an aluminide (such as NiAl).

A NiAl layer can be formed by exposing a Ni-based alloy to $AlCl_3$ and $H_2$ at high temperature, preferably at least 700° C., in some embodiments 900 to 1200° C. Aluminum is deposited at the surface as a result of the reaction between $AlCl_3$ and $H_2$. At temperature, Ni from the substrate would diffuse towards the surface and react with the aluminum to form a surface layer of nickel aluminide. The Ni source could be Ni in a Ni-based alloy substrate, an electrolytically plated Ni layer, or a vapor deposited Ni layer that can be deposited over a substrate prior to aluminidization. It is believed that other metal aluminides (such as Co or Fe) could be formed under similar conditions.

Preferably the aluminidization is conducted with good control of flow to the device through a manifold, for example, good control can be obtained by passing flow into microchannels through a leak-free manifold that is integral to the microchannel device. Preferably the aluminidization process is carried out at 100 Torr (2 pounds per square inch absolute, psia) to 35 psia (1800 Torr), more preferably between 400 Torr (8 psia) and 25 psia (1300 Torr).

In preferred embodiments, nickel aluminide contains 13 to 32% aluminum, more preferably 20 to 32%; and still more preferably consists essentially of beta-NiAl. If Al falls significantly below the 13% weight % level of the gamma-prime phase, it may be expected to negatively affect the quality of the thermally-grown alumina scale.

In some embodiments, the metal aluminide layer has a thickness of 1 to 100 micrometers; in some embodiments a thickness of 5 to 50 micrometers. In some embodiments, the aluminide layer is completely oxidized; however, this is generally not preferred.

The metal surface upon which the metal aluminide is formed is preferably substantially free of oxides. Optionally the surface can be cleaned, polished, or otherwise treated to remove such oxides if any are present.

A reactor can be formed by a catalyst that is disposed as a coating on an internal wall (where the walls can be simple walls or shaped walls). Alternatively, or in addition, inserts such as fins, plates, wires, meshes, or foams can be inserted within a channel. These inserts can provide additional surface area and effect flow characteristics. An aluminization process can be used to fix inserts onto a wall of a device (such as a reactor); the resulting aluminum layer (or aluminum oxide, or aluminum, or metal aluminide, or a mixture of these) fills some voids and greatly improves thermal conduction between the insert and device wall (such as reactor wall).

Thermally Grown Oxide

Metal aluminide or more preferably NiAl layer, is heated in the presence of oxygen or other oxidant to grow a layer of aluminum oxide. It was surprisingly discovered that when the surface was heated to the treatment temperature in the absence of $O_2$ or other oxidant prior to the oxide growth at temperature, a significantly improved oxide coating resulted. The oxide layer grown by heating the surface to the treatment temperature in the presence of oxygen exhibited spalling while the layer grown by heating the surface from ambient temperature to the treatment temperature in the absence of oxygen did not. Oxygen can be substantially excluded from the heat up step of the heat treatment process.

A convenient and preferred method of excluding oxygen from the surface while heating the surface from ambient temperature to treatment temperature involves exposure to hydrogen. The hydrogen effectively reduces the oxidizing power of the atmosphere during heat up to prevent premature growth of the oxide scale. Other gases that reduce the oxidizing power of the gas, such as NH3, CO, CH4, hydrocarbons, or the like, or some combination of these could also be used. All of these reducing gases could be used in combination with inert gases such as N2, He, Ar, or other inert gases, or combinations of inert gases.

The oxide layer is formed by exposing the surface to an oxidizing atmosphere at or within 100 C of the treatment temperature. The oxidizing gas could be air, diluted air, oxygen, CO2, steam or any mixture of these gases or other gases that have substantial oxidizing power, with or without an inert diluent. The inert diluent could be inert gases such as N2, He, Ar, or other inert gases, or a combination of inert gases. The temperature of oxide growth is at least 500° C., preferably at least 650° C. The surface can be exposed to the treatment condition in stages of different temperatures, different oxidizing powers, or both. For example, the surface could be treated at 650° C. for a time and then heated to 1000° C. and kept at 1000° C. for an additional time. Such controlled and staged surface treatment can generate a surface structure of a desired morphology, crystalline phase and composition.

Superior oxide coatings result from preheating to about 1000° C. (in some embodiments at least 900° C.) under an inert, or preferably, a reducing atmosphere such as a $H_2$-containing atmosphere (preferably at least 1000 ppm $H_2$, in some embodiments 1 to 100% $H_2$). Preheat under a reducing atmosphere was observed to produce superior oxide coatings with little or no spalling. It is believed that this control of preheat conditions results in superior coatings because it minimizes the formation of nickel oxide. Great care must be taken selecting a truly "inert" atmosphere because atmospheres conventionally considered as inert atmospheres yield inferior results. That is because nickel oxide can theoretically form even at $10^{-10}$ atm oxygen and chromia at $10^{-21}$ atm oxygen; such extreme levels of purity are not available in commercially available gases. Therefore, reducing atmospheres are preferred.

Conventional wisdom suggests that the higher the temperature, the faster the oxidation rate. Surprisingly, we discovered that the oxide grew faster at 1000° C. than at 1050° C. One possible explanation is that the high temperature oxide could be denser, thus discouraging faster growth. The lower temperature oxide could be more porous thus allowing faster oxide growth. On the other hand, too high a temperature will promote interdiffusion between the aluminide layer and the substrate, and the aluminide will disappear into the bulk of the alloy. Therefore, the thermally-grown oxide is preferably conducted in the temperature range of 1000 to 1100° C., more preferably 1025-1075° C. In the presence of excess oxygen, for example flowing air, the oxidation treatment is preferably conducted for 30 to 6000 min, more preferably 60 to 1500 min.

Figure 2:
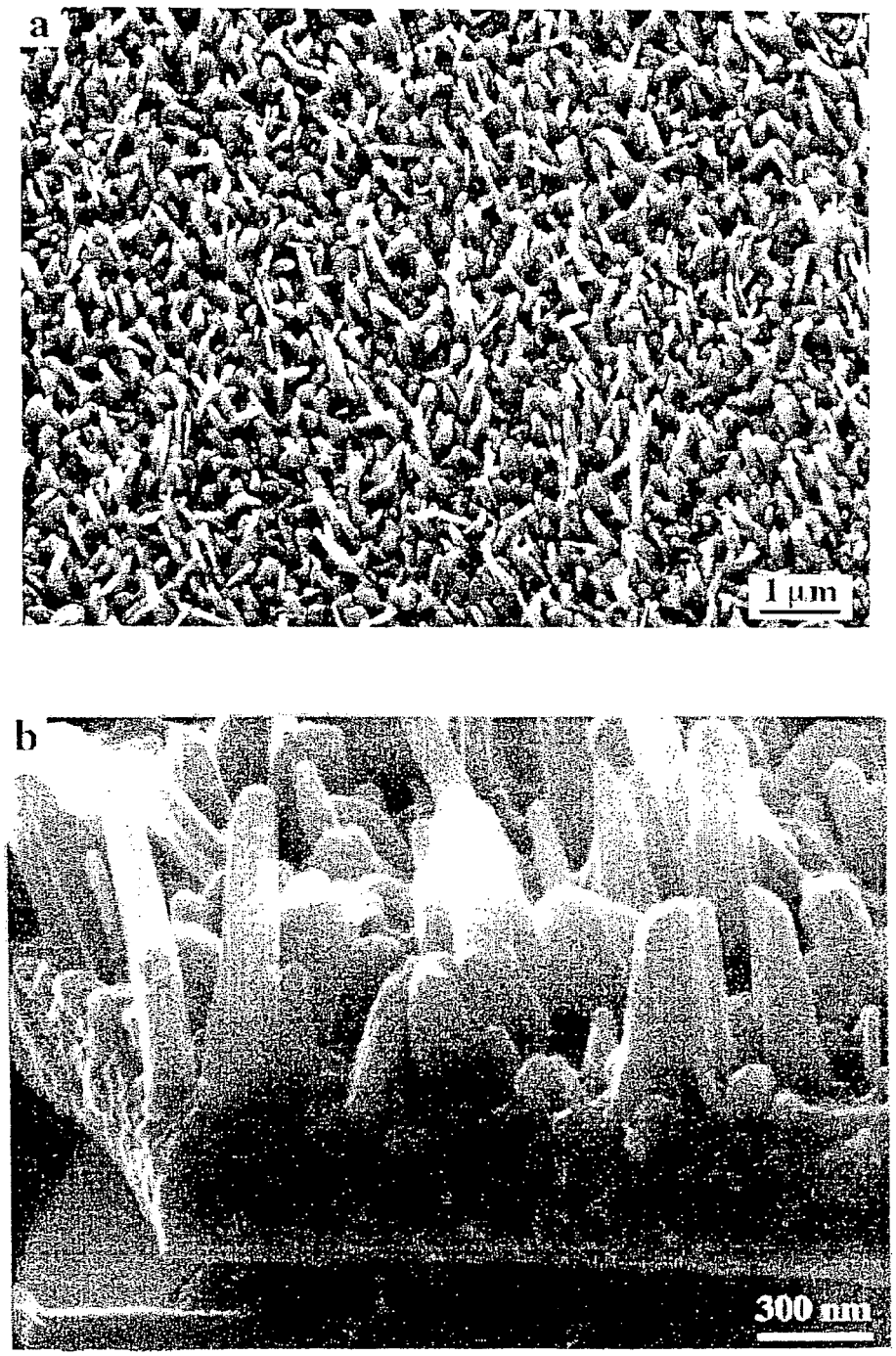
FIG. 2 is a scanning electron microphotograph of theta ($\theta$) alumina whiskers grown from NiAl.

Although it had never previously been known for making catalysts, it has been known that theta (Θ) alumina whiskers can be grown from NiAl. Alumina whiskers are substantially rod-shaped or needle-shaped with an aspect ratio of at least 10. An example of these whiskers on Inconel is shown in FIG. 2.

It should be recognized that the term "alumina" can be used to refer to a material containing aluminum oxides in the presence of additional metals. In the descriptions herein, unless specified, the term "alumina" encompasses substantially pure material ("consists essentially of alumina") and/or aluminum oxides containing modifiers.

Thinner layers are less prone to cracking; therefore, the thermally-grown oxide layer is preferably 5 μm thick or less, more preferably 1 μm thick or less, and in some embodiments is 0.1 μm to 0.5 μm thick. In some preferred embodiments, the articles have an oxide thickness of a thermally grown scale of less than 10 micrometers, and in some embodiments an oxide thickness of a thermally grown scale in the range of about 0.1 to about 5 micrometers. In some embodiments, thicker oxide layers may be useful, such as for a higher surface area catalyst support. In some preferred embodiments, the articles have an oxide thickness of a washcoat of less than 10 micrometers, and in some embodiments an oxide thickness of a washcoat in the range of about 1 to about 5 micrometers. Typically, these thicknesses are measured with an optical or electron microscope. Generally, the thermally-grown oxide layer can be visually identified; the underlying aluminide layer is metallic in nature and contains no more than 5 wt % oxygen atoms; surface washcoat layers may be distinguished from the thermally-grown oxide by differences in density, porosity or crystal phase.

The aluminized surface can be modified by the addition of alkaline earth elements (Be, Mg, Ca, Sr, Ba), rare earth elements (Y, La, Ce, Pr, Nd, Pm, Sm, Eu, Gd, Tb, Dy, Ho, Er, Tm, Yb, Lu) or combinations of these. The addition of these elements is followed by a reaction with an oxidizing atmosphere to form a mixed oxide scale. When the modifying element is La, for example, the scale contains LaAlOx, lanthanum aluminate. In some embodiments, a stabilized alumina surface can be formed by adding a rare earth element such as La, coated with a layer of alumina sol, then doped with an alkaline earth element such as Ca followed by a heat treatment.

La was demonstrated to be effective in improving the adhesion between the sol-alumina coating and the alumina scale. Inconel™ 617 substrate after aluminization and heat treatment was coated with an aqueous solution of La nitrate, followed by drying and air calcination at 1,000° C. for 4 hr. It was then coated with sol-alumina and exposed to the corrosion testing environment at 960° C. for 1,000 hr. The sol-alumina coating survived well, with no visible signs of damage such as flaking or cracking. In contrast, similar testing with an Inconel™ 617 substrate after aluminization and heat treatment and coated with sol-alumina without pretreatment with an aqueous solution of La nitrate, showed that most of the sol-alumina coating was lost after only 100 hr of testing, suggesting insufficient adhesion between the sol-alumina and the alpha-alumina scale on the aluminide.

The benefit of La as an adhesion promoter is believed to be associated with its reaction with the alpha alumina scale to change the surface to a more chemically active La aluminate. Surface X-ray diffraction (XRD) showed the formation of $LaAlO_3$. Without La addition, only alpha alumina and some background nickel aluminide could be detected by surface XRD.

Flow Rates

The aluminum-containing layer and alumina layers are preferably formed by reacting a surface with a gaseous reactant or reactants under dynamic flow conditions. The aluminum can be deposited in a microchannel by flowing $AlCl_3$ and $H_2$ into a microchannel. In a multichannel device, the Al can be deposited only on selected channels (such as by plugging certain channels to exclude the aluminum precursors during a CVD treatment). The aluminum can also be applied onto selected portions of a microchannel device by controlling relative pressures. For example, in a microchannel device that contains at least two channels separated by a wall and in which the two channels are connected to each other via orifices in the wall, $AlCl_3$ flows through a first channel while $H_2$, at a higher pressure, flows through a second channel and through the orifices into the first channel.

Static gas treatments can be conducted by filling the desired areas with the reactive gases with interim gas pumping if needed.

Figure 3:
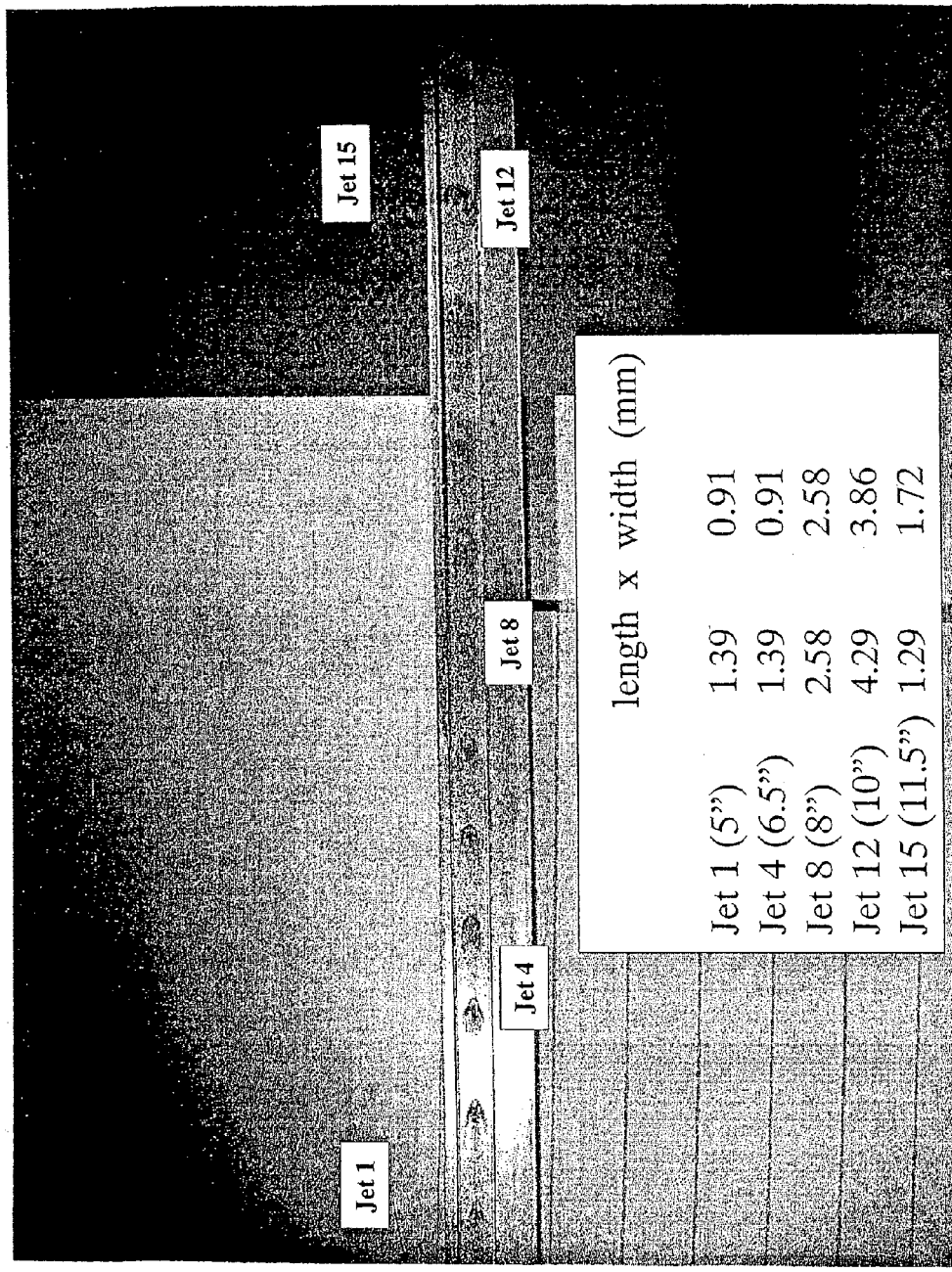
FIG. 3 is a photograph of a cut-open, microchannel device showing an aluminidized channel surface. This surface was on the side of a microchannel that was opposite a side having orifices (jets) and aluminizing gas flowed through these orifices and impacted the surface, causing jet impingement defects.

It has been found that excessively high flow rates can lead to uneven coatings. An example of this problem can be seen in FIG. 3.

Two flow metrics have been established for characterizing the extent of shear and jet impaction. For mechanical shear, the total wall shear stress (two tangential components and one normal component) has been selected as the relevant metric. Likewise dynamic pressure, which is equal to the momentum flux of the jet plume, has been chosen as a means of monitoring the effects of jet impaction on coating formation.

Computational fluid dynamic (CFD) simulations of several device aluminization tests were conducted to contrast the predicted values for wall shear stress and dynamic pressure in regions where the treatment was not successful to those regions where treatment was successfully applied. These simulations used as boundary conditions the same temperature, flow rates, stream composition, and flow input/out put configuration as was used in the respective device aluminization process. Comparisons utilized autopsy results of aluminized and heat treated devices. It was determined from these studies that there could be established a threshold value for both wall shear stress and dynamic pressure whereby for flow conditions in which both shear and dynamic pressure were below the threshold values, good treatment should take place; and when the threshold value of either variable was exceeded, the treatment could be flawed.

Metric Thresholds

Wall shear stress is expressed as $\tau = \mu |\vec{\nabla}\mu|$ or the product of the fluid viscosity $\mu$ and the magnitude of the local velocity gradient, expressed in units of force per channel wall unit surface area. This quantity reflects the magnitude of the molecular frictional forces at the interface between a very thin fluid layer and the channel wall itself.

The dynamic pressure (or equivalently the momentum flux) is given by the expression $$p = \frac{1}{2}\rho u^2$$

where $\rho$ denotes the fluid density and u the local fluid velocity magnitude. It is a measure of the force imparted by the change in momentum when a jet plume strikes the side of a channel and is also expressed in terms of force per unit area. CFD simulations of a number of combustion test devices were performed to determine if there was any definitive correlation between poor aluminide coating and critical values in either wall shear stress or dynamic pressure.

Based on a detailed analysis of the tested devices, the following thresholds were established:

Wall Shear Stress: To ensure drag forces do not impair the formation of aluminization coating, the wall shear stress should not exceed 50 Pa if the aluminization gases are flowing through a jet orifice. Allowable wall shear stress should not exceed 200 Pa if the aluminization gases are not impinging on the wall of a microchannel as through a jet orifice.

Wall Dynamic Pressure: To ensure momentum impact erosion does not impair the adequate formation of aluminization coating, the wall dynamic pressure should not exceed 10 Pa if the aluminization gases are flowing through a jet orifice. Substantially higher wall dynamic pressure is allowed in the absence of a jet orifice. Allowable wall dynamic pressure should not exceed 100 Pa if the aluminization gases are not impinging on the wall of a microchannel as through a jet orifice.

Practical Application

The metrics presented above are used to determine the flow configuration and individual inlet flow rates that will imply good aluminization treatment from a fluidics standpoint. Generally there are a combination of possible input and output flow paths for a device. CFD predictions are used to determine those inflow/outflow combinations and the individual inlet flow rates that will result in globally maintaining the wall shear stress below $5\times10^{-3}$ PSI and the wall dynamic pressure below $1\times10^{-3}$ PSI throughout the entire device. The maximum allowable inlet flow rate that satisfies these two criteria and the associated flow configuration becomes the maximum recommended rate for aluminizing the device based on the metrics developed here. Examples of the aluminide coating resulting from this guidance produced aluminide coatings without visual defects.

A surprising discovery of this invention is that flowing (nonstatic, see previous discussion on preferred pressures) aluminizing gas at rates below the threshold rates discussed above produced defect-free, highly uniform (less than 10% variation in thickness) aluminide coatings.

Masking

The aluminizing processes discussed above produce aluminide coatings throughout a channel. However, it is theoretically possible to selectively coat portions of a channel by masking off sections of a channel. This might be done by masking portions of a sheet with a refractory material and then laminating the masked sheet into a laminate. After aluminization the mask could be removed, such as by burning. Possible refractory materials might include Mo, diamond, and graphite. Masking techniques have been mentioned in U.S. Pat. No. 6,332,926.

Acid or Base Etch

Adhesion and/or surface area can be increased by an acid or base etch. Preferably this is conducted at moderate conditions on the thermally grown alumina layer. Severe conditions may result in excessive etching. Therefore, the (optional) etching step or steps are conducted at a pH of less than 5 (preferably 0 to 5) or greater than 8 (preferably 8 to 14).

Sintering Aids

A sintering aid can be added either as a solution applied onto the alumina scale or in a mixture. The purpose of a sintering aid is two fold: 1) locally reduce melting temperatures of the oxide substrate (e.g., the oxide scale) to promote diffusional bonds between it and the ceramic particles and 2) to create a glassy phase that forms at grain boundaries and suppress oxygen diffusion from further oxidizing an underlying metallic substrate. For alumina layers, sintering aids comprise Na, Li and/or B. Aqueous compositions comprising (or consisting essentially of) Li or Na borate salts constitute a particularly preferred treatment for an alumina scale. In some preferred embodiments, the invention comprises an oxide layer disposed over a metal substrate where the oxide scale comprises metal oxide particles having sintering aid elements dispersed along the grain boundaries and, preferably, on the surface. Sintering aids can be chosen which are benign or preferred to the target catalytic processes.

In a preferred embodiment, a sintering aid is applied to the surface of an oxide scale. The resulting surface is then treated with a ceramic suspension. In a particularly preferred embodiment, the ceramic suspension comprises a solvent, ceramic particles, a dispersant to prevent particle agglomeration, an organic binder to provide strength to the film of ceramic particles when dried, and a plasticizer to increase the plasticity of the binder. Plasticizers, surfactants, and binders are organic materials which can be readily removed by simple calcinations in air at relatively low temperatures. The resulting article is dried to remove liquid and then heated to elevated temperatures. During this process, the sintering aid locally melts the ceramic particles at contact points (with the applied oxide particles) and promotes diffusional bonding between the oxide scale and the ceramic particles. In some of its broader aspects, this process is general and can be applied over any oxide layer that is subsequently treated with a composition of oxide particles. Additional coatings with oxide compositions can increase thickness of the oxide layer and provide support for subsequent application of catalytically active particles. Selection of appropriate treatment temperatures and/or control of sintering aid levels can prevent excessive surface area reduction in subsequently applied oxide layers.

In some embodiments, an oxide surface is treated with a sintering aid and then heat treated. Subsequently, the resulting surface is treated with ceramic particles (for example, in the form of a powder or suspension). In one test, an alumina disk was treated with a composition made by dissolving 1.66 g PVA, 3.3 g $Li_2B_4O_7$ and 7.4 g $Na_2B_4O_7 \cdot 10H_2O$ in 83 g of water. The disk was then heat treated at 900 C for one hour. Alumina powder was then sprinkled over the disk and the treated disk was again heat treated at 900 C for one hour. Results are shown in FIG. 2 which shows that the treated disk exhibited sintering and adhesion of the alumina powder. Better sintering was observed on the treated vs. untreated area of the disk, with formation of a glassy phase at the grain boundaries.

The sintering aid or aids should be added in an amount sufficient to obtain its desired purpose. Thus, in some embodiments, sufficient amounts of sintering aids are added such that an increased amount of glassy phase is observed as compared with an identically treated sample without sintering aids. Sintering aids (when used) are preferably present in coating solutions in at least 0.5 wt %. A coating or a layer in a coating may have sintering aids in an amount, in some embodiments of at least 0.5 wt %. The wt % refers to wt % in an oxide coating or in a layer within a coating among multiple layers (the multiple layers can be oxide or nonoxide layers). Preferably, the oxide layer containing the sintering aid is alumina.

Figure 4:
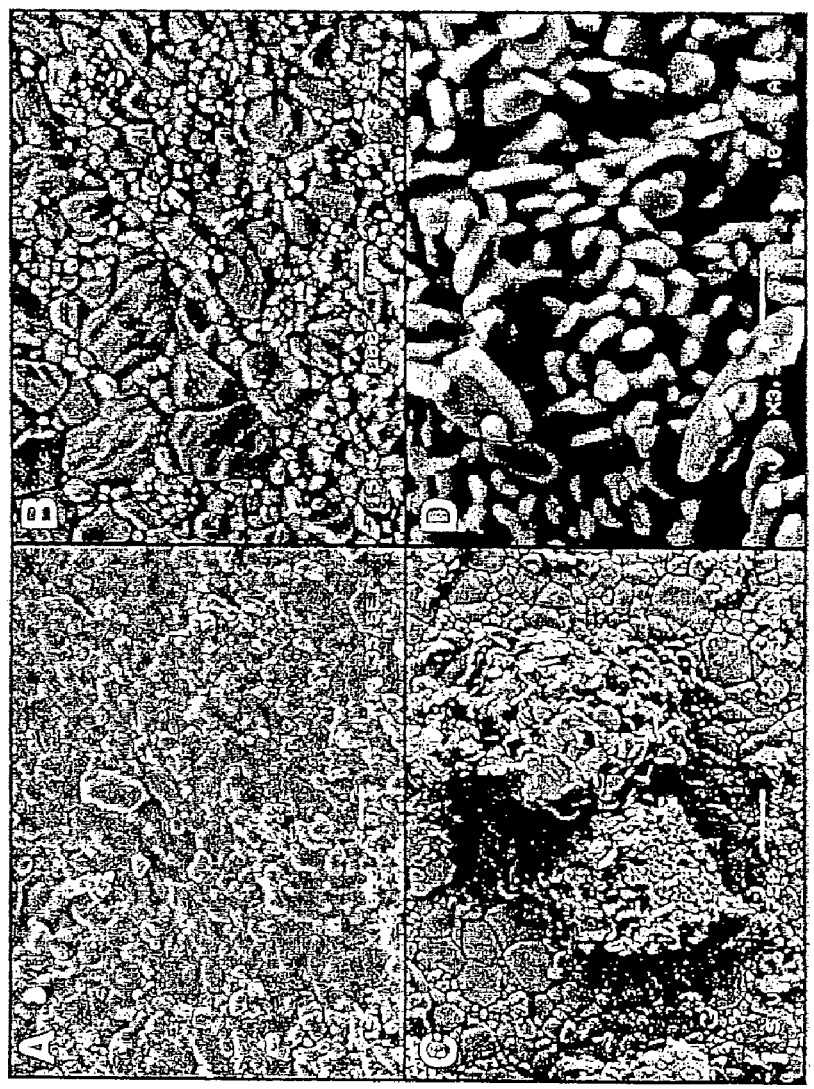
FIG. 4 shows SEM micrographs of an alumina disk that was treated with a Li—Na—B solution and heat treated at 900° C. for one hour. After cooling to room temperature, alumina powder was sprinkled onto the surface of the coated area and the disk was reheated at 900° C. for one hour. A—an uncoated area of the disk. B—coated area of disk. C, D—coated area where powder was applied. In B, C and D, the sintering aid solution reacted with the alumina to create a glassy phase at the grain boundaries and also bonded alumina powders to the substrate.

As shown in FIG. 4, excellent film formation was observed for an Inconel specimen that was aluminidized, heat treated to grow an oxide scale, etched with base, coated with a sintering aid solution, and heat treated.

Figure 5:
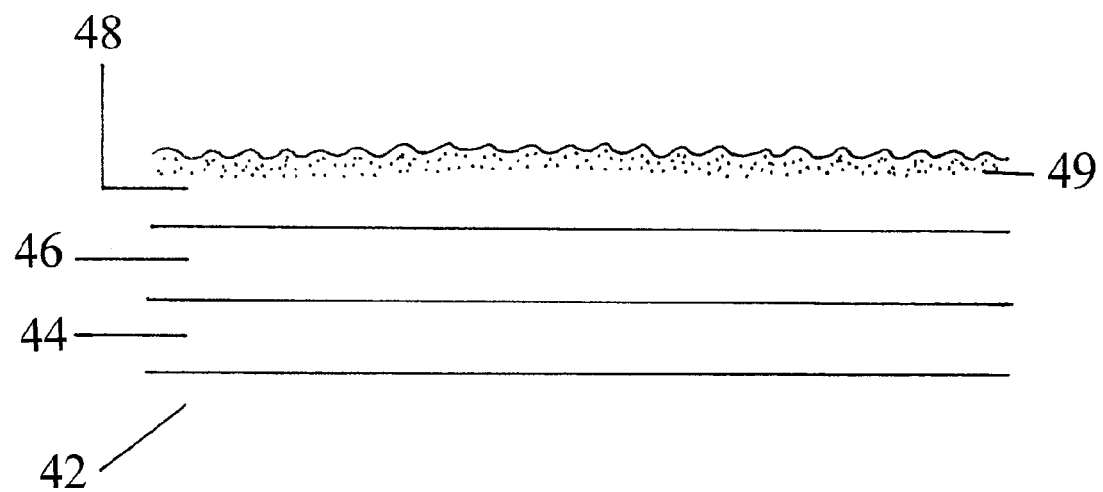
FIG. 5 is a schematic illustration of an aluminide coated substrate.

FIG. 5 schematically illustrates an application in which a metal substrate 42 has a first layer of aluminide 44, a layer of alumina with sintering aid(s) 46, and a layer of alumina 48. In preferred embodiments, the outermost layer further comprises an additional catalytically active material 49.

Several rheologically enhanced suspensions were prepared and tested. These suspensions contained water as the solvent, 14 to 15 wt % aluminum oxide powder as the ceramic particles, 1.43 wt % Tergital® (nonylphenol polyethylene glycol ether) as the surfactant, 0.14 wt % poly-ethylene glycol (PEG) as the plasticizer and 0.28 wt % polyvinylpyrrolidone (PVP) as the binder. These suspensions exhibited superior coating properties as compared with unmodified alumina.

More generally, sintering aids can be used in preparing thin ceramic films. This type of formulation could be used as a high-temperature adhesive to create complex ceramic shapes, to develop oxygen impermeable thermal barrier coatings, as well as wear or chemically resistant coatings. For instance, it could find application in the semiconductor industry where tape casting is used to develop multi-layer ceramic modules, the fuel cell industry where ceramic parts are used to develop solid oxide fuel cells, surfaces inside chemical reactors, and/or the automotive industry for chemically resistant, wear resistant coatings. Especially preferred uses of the sintering aids are in forming ceramic layers in catalysts (typically having another higher surface area catalyst support layer and a catalytically active material that may be in an additional layer or within the support layer), and in protecting surfaces of microchannel apparatus.

Other Coating Modifications

Various other modifications can be used to enhance adhesion or other properties of alumina coatings over the alumina scale. An alumina coating can be deposited using an alumina sol or slurry.

In some preferred embodiments, instead of a single alumina coating, multiple alumina coatings are applied to the surface where at least two of the layers (more preferably at least 4 layers) have graded properties. For example, a first coat could be calcined at a first temperature (T1) and a subsequently deposited coat calcined at a lower second temperature (T2) resulting in graded coatings of increasing surface area. Other graded layers could be formed by: the graded use of water vapor during calcination; differing particle sizes in the coatings (smaller particles could be used for the first coat or coats thus increasing physical contact between the particles and the scale, while larger particles are present in later coats); and/or the graded use of stabilizers or binders (where the binders are subsequently burned out).

Additives such as rare earths or alkaline earth elements (including La, Ce and/or Pr) can increase hydrothermal stability of an alumina coating.

Surfactants can be added to coating solutions. Preferred classes of surfactants include: colloidal, non-ionic, anionic, cationic, and amphoteric, and in some embodiments, surfactants are present in at least 0.1 wt %, in some embodiments at least 0.01 wt %, and in some embodiments in the range of 0.01 to 5 wt %. Water soluble polymers such as polyvinylalcohol (PVA), polyvinylpyrrolidone, PLE, and polycup can be added to the coating composition. The polymers may reduce cracking during drying and form added porosity after burn out. The addition of titanium oxide to promote adhesion is another possibility.

Prior to coating, the alumina scale can be treated with rare earths or alkaline earth elements (including Mg or La) (and, optionally, a surfactant such as polyvinylalcohol) followed by a high temperature treatment to make the scale's surface more active for adhesion. Use of wetting agents and surfactants increases the amount of additive metal that can be added to the alumina surface in each solution coating step.

Catalyst Coatings

Catalysts can be applied using techniques that are known in the art. Impregnation with aqueous solutions of salts is preferred. Pt, Rh, and/or Pd are preferred in some embodiments. Typically this is followed by heat treatment and activation steps as are known in the art. Salts which form solutions of pH>0 are preferred.

Reactions

The coated microchannel apparatus is especially useful when used with a surface catalyst and at high temperature, for example, at temperatures above 500° C., in some embodiments 700° C. or higher, in some embodiments 900° C. or higher.

In some aspects, the invention provides a method of conducting a reaction, comprising: flowing at least one reactant into a microchannel, and reacting the at least one reactant in the presence of a catalyst within the microchannel to form at least one product. In some embodiments, the reaction consists essentially of a reaction selected from: acetylation, addition reactions, alkylation, dealkylation, hydrodealkylation, reductive alkylation, amination, ammoxidation, ammonia synthesis, aromatization, arylation, autothermal reforming, carbonylation, decarbonylation, reductive carbonylation, carboxylation, reductive carboxylation, reductive coupling, condensation, cracking, hydrocracking, cyclization, cyclooligomerization, dehalogenation, dimerization, epoxidation, esterification, exchange, Fischer-Tropsch, halogenation, hydrohalogenation, homologation, hydration, dehydration, hydrogenation, dehydrogenation, hydrocarboxylation, hydroformylation, hydrogenolysis, hydrometallation, hydrosilation, hydrolysis, hydrotreating (HDS/HDN), isomerization, methylation, demethylation, metathesis, nitration, polymerization, reduction, reformation, reverse water gas shift, Sabatier, sulfonation, telomerization, transesterification, trimerization, and water gas shift. Combustion is another preferred reaction. Hydrocarbon steam reforming is especially preferred (such as methane, ethane or propane steam reforming).

EXAMPLES

Corrosion Protection

Figure 6:
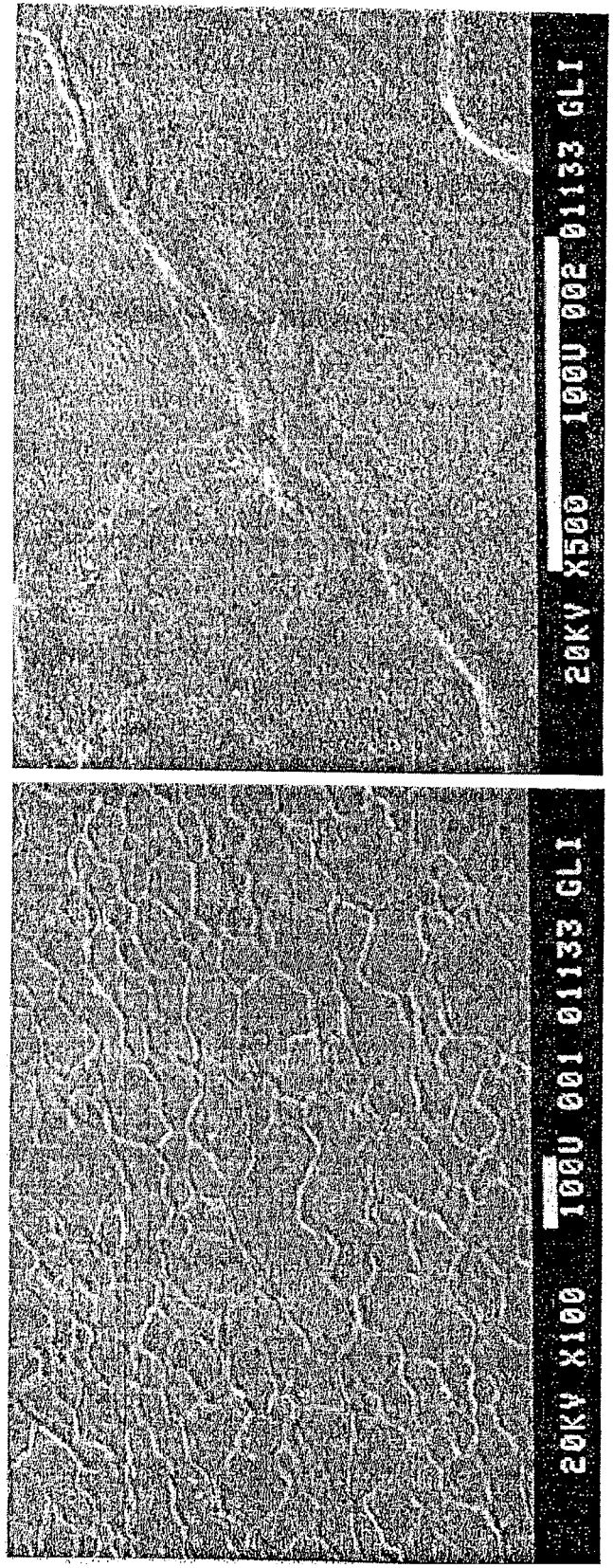
FIG. 6 is a SEM micrograph of an alumina surface after corrosion testing exposed to an atmosphere of 17% H20, 2.5% O2, 23% CO2, balance N2, for 1000 hours at 960° C.

Samples of Inconel™ 617 were corrosion tested with and without a protective aluminide coating. The aluminide coated sample was made by forming a layer of aluminide and heating under H2 atmosphere and then exposing to air at 1050° C. Both samples were corrosion tested at 960° C. and 17% water, 2.5% $O_2$ for 1000 hours. The uncoated sample showed pitting after 100 hours of testing. In contrast, the aluminide/alumina coated sample showed no observable change after 1000 hours of corrosion testing. See FIG. 6, which shows no damage to the alumina layer. The grain boundaries shown in the figures were also present prior to the corrosion testing. Further corrosion testing to 4400 hours also showed no damage to the coating.

Uniform Coatings in a Multichannel, Microchannel Device

Figure 7:
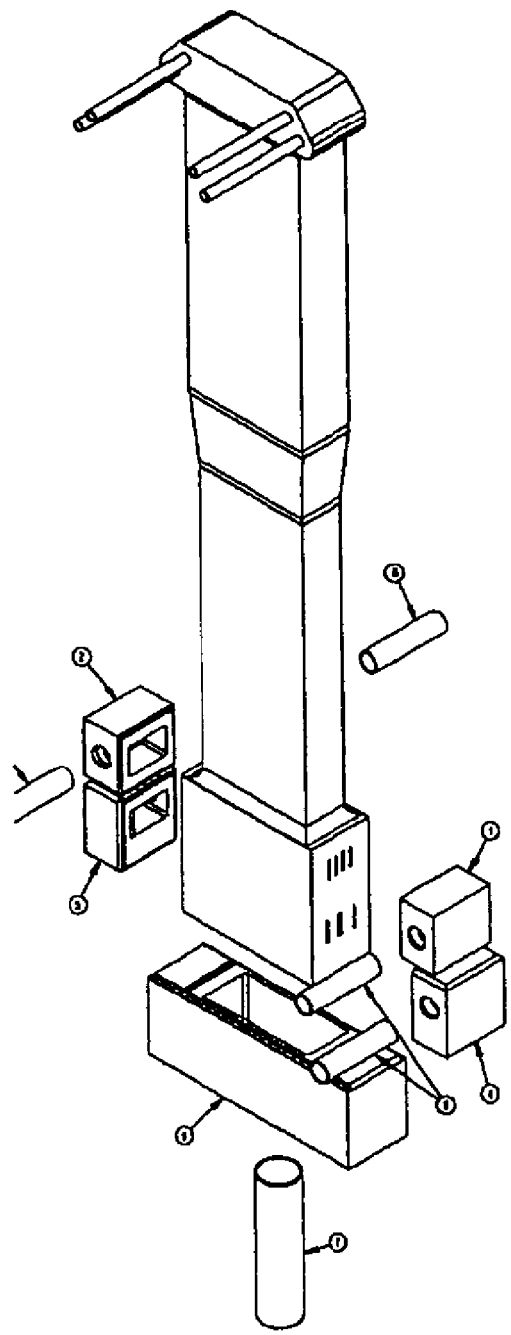
FIG. 7 is a partly exploded view of a multichannel, microchannel device in which the internal microchannels were coated with aluminide.

A microchannel device (FIG. 7) having 48 sets (4×12) of parallel channels, with each set consisting of 5 individual channels. The device is designed for steam reforming of methane (SMR) and contains an integrated combustor (Fuel, Air and Exhaust for the combustion and Reactant and Product for the SMR). The device is over 20 inch (50 cm) long, making the aluminization circuit over 40 inch (1.0 m) long (Exhaust connected to Fuel and Air, Product connected to Reactant). The Fuel and Air channels are in communication via an array of jet holes in each pair of channels.

Figure 8:
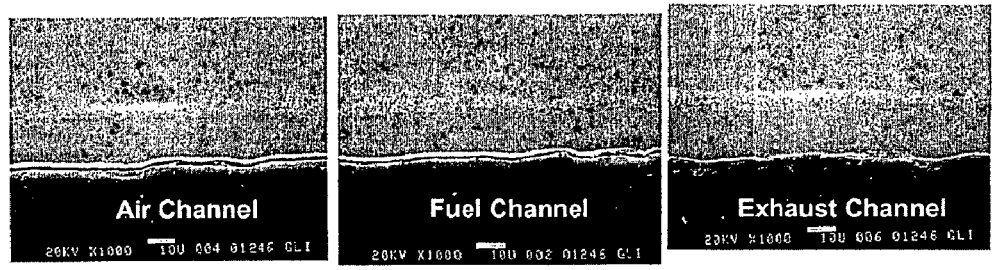
FIGS. 8 and 9 are cross-sectional SEM micrographs of aluminidized channels within the device of FIG. 7.
Figure 9:
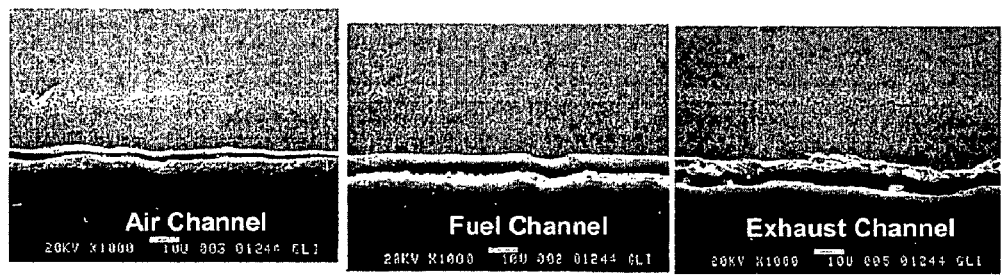

The SMR channels were blanketed off with an argon flow while channels in the combustion circuit were aluminidized. Calculations showed that the flow of aluminizing gas through the microchannels was highly non-uniform with flow rates in some channels 10 times greater than others, while the surface area within each microchannel was relatively similar. This difference in flows is due to the complex design of the channels. The CVD vapor flow was fed from the exhaust manifold, flowed through the exhaust channels, through a u-bend and then into the fuel and air channels and exited through the fuel and air manifolds. After aluminidization, the device was cut open and various channels were inspected by SEM. Cross-sectional samples were viewed at the midpoint of the device (FIG. 8) and near one end—this end is both near the start of the aluminization circuit (exhaust channel) and the end of the aluminidization circuit (air and fuel channels), FIG. 9.

From the SEM data it can be seen that the aluminide coatings were highly uniform both along the length of each channel as well as channel-to-channel, despite the large difference in channel-to-channel flow rates. In each case, coating thicknesses appeared to be within about 10%. Additionally, the coatings appeared to be essentially defect-free.

Coatings at Corners

Figure 10A:
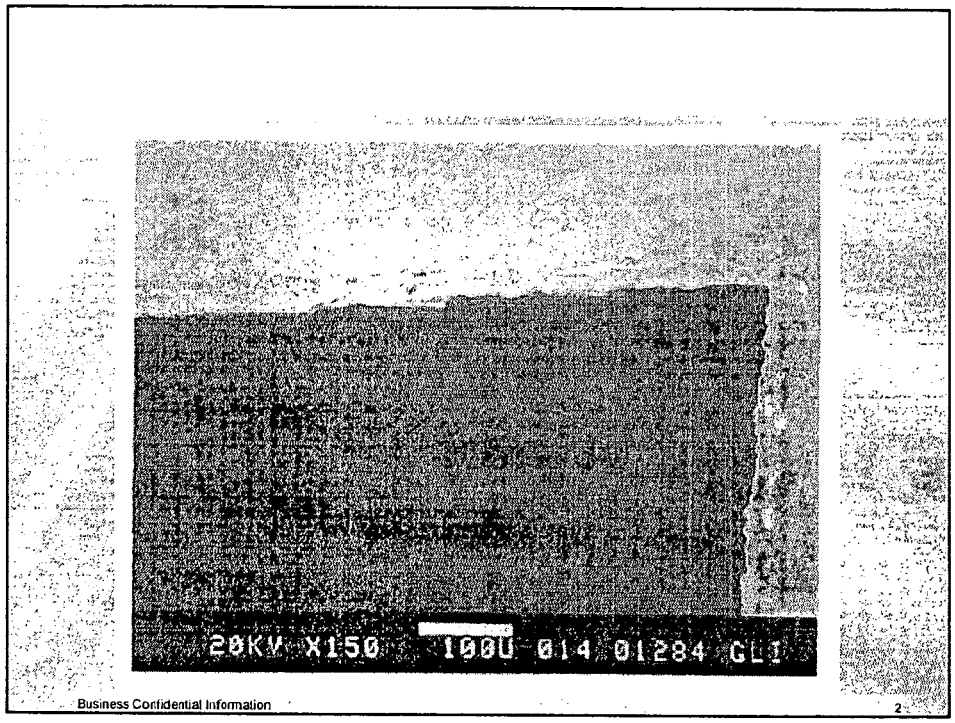
FIG. 10a shows a cross-sectional SEM micrograph of an aluminidized corner within a microchannel.
Figure 10B:
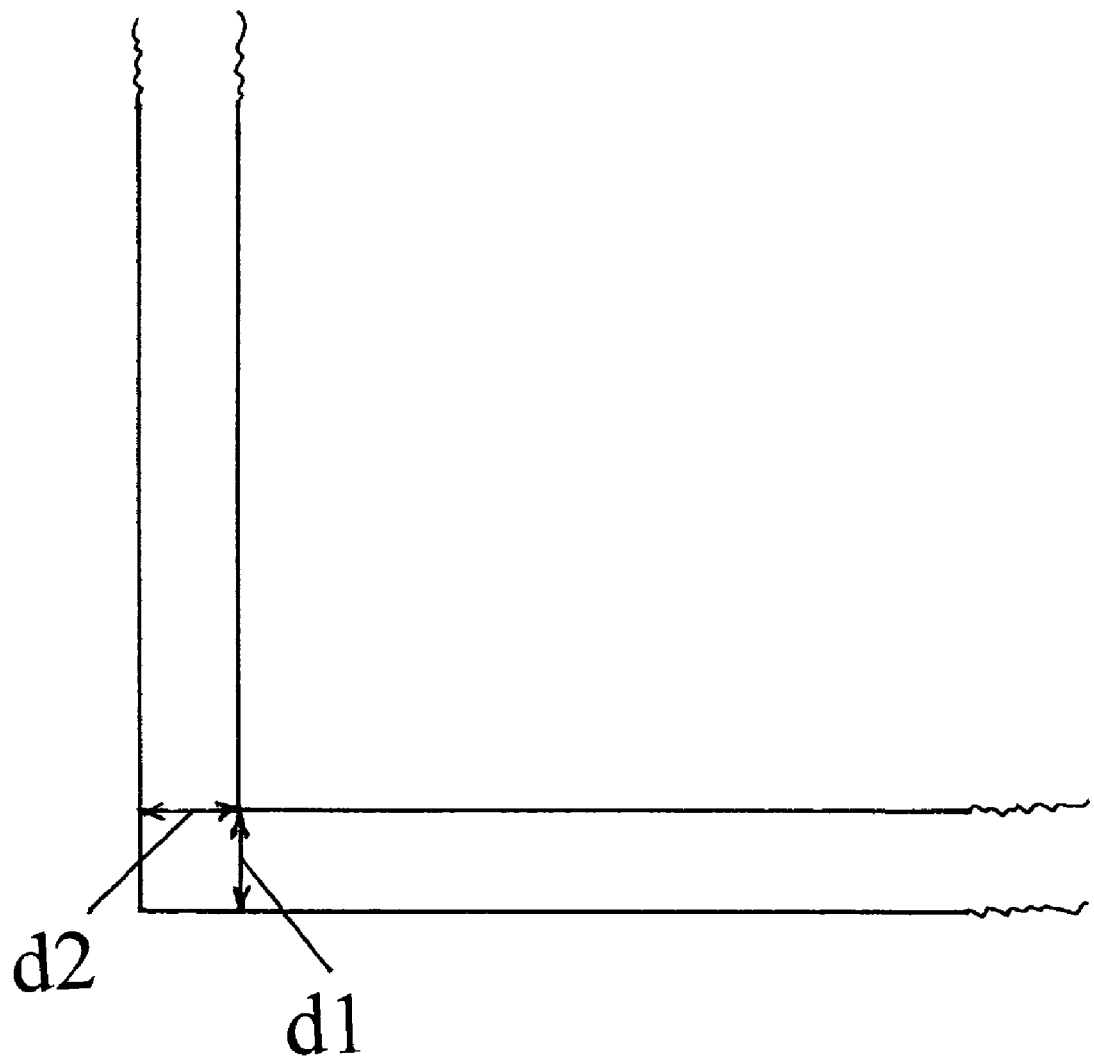
FIG. 10b illustrates distances that can be measured to characterize a corner coating.

Interior corners of microchannel devices were inspected by SEM. These devices were again Inconel™ 617 coated with an aluminide layer. Sharp (90±20°), well-formed corners coated with an aluminde layer were surprisingly found to have conformal coatings (see FIG. 10a) with a sharp angle at the interface between the channel's interior (dark area) and the aluminide coating. For purposes of measuring the angle of the coating, the angle of the coating is based on averaging surface roughness for 100 μm along each edge from the corner. In some preferred embodiments, the angle of the coating is 90±20°, in some preferred embodiments 90±10°. Another measure is the thickness ((d1+d2)/2) of the coating at the perimeter of the corner coating (see FIG. 10b) based on extensions (d1 and d2) of the same 100 μm lines used to measure coating angle; preferably this thickness of the coating at the perimeter of the corner coating is within 25%, more preferably within 10% of either the average coating thickness (averaged over a microchannel wall, or microchannel wall segment, terminating at the corner), or within 25%, more preferably within 10% of either the midpoint thickness (measured at the midpoint of a microchannel wall, or microchannel wall segment, terminating at the corner).

Figure 11:
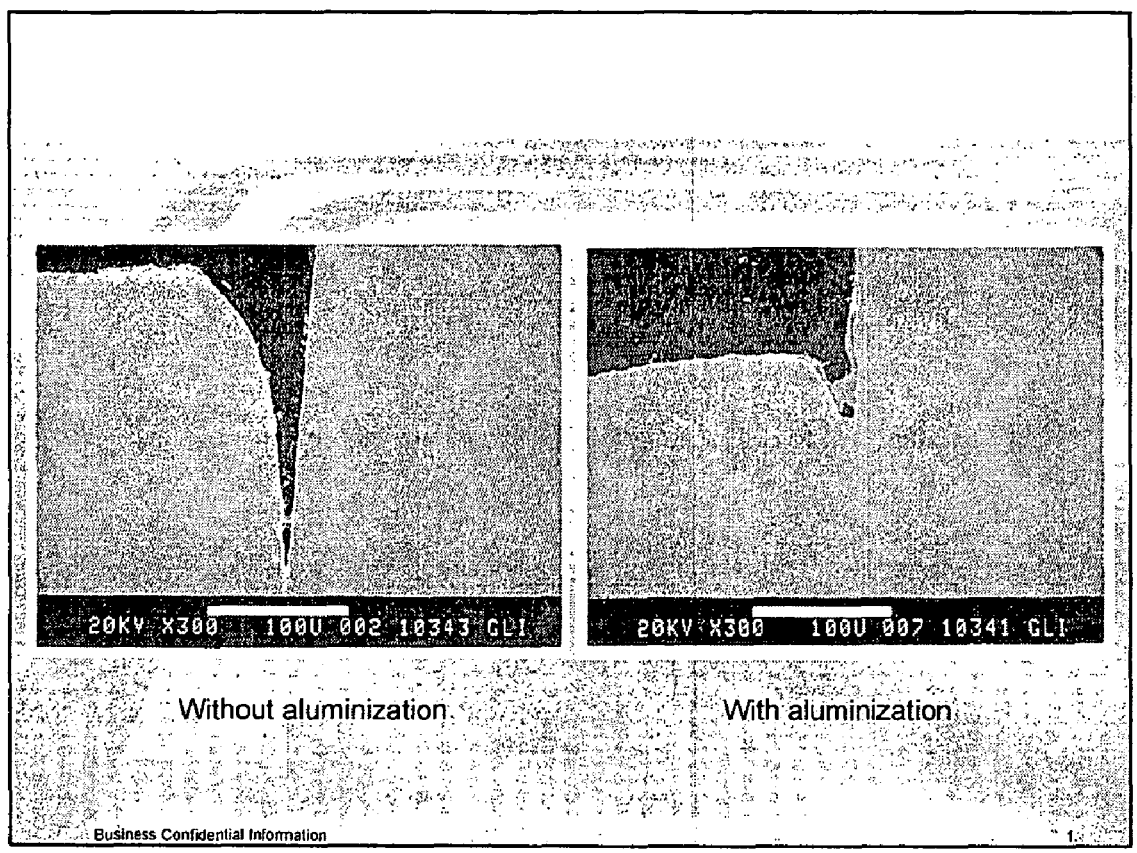
FIG. 11 shows a cross-sectional SEM micrograph of an aluminidized crevice at a microchannel corner.

Crack filling is shown in FIG. 11. In this example, the Inconel sheets were stamped. The stamping process tends to result in slightly curved edges, and these curved edges can result in gaps at the corners formed between two laminated sheets. The aluminide coating fills this gap, again this occurs in a conformal fashion with the thickness of the coating being uniform with elsewhere on the microchannel up until the point that the gap is filled and the coating can no longer grow. In other words, thickness appears to be limited by distance from the metal substrate.

Multichannel Sol Coated Device

A microchannel test device with 48 sets of channels was prepared with post-assembly coatings and tested. The device was made from sheets of an Inoconel™ Ni-based superalloy. An aluminide layer was formed over the alloy. Then it was oxidized (as described above) to form an alumina layer. Several solution-based coatings were applied. To apply the coatings, the device was oriented on one end (the straight microchannels were oriented parallel to gravity), and, in each step, the liquid was added through an inlet located at the bottom (with respect to gravity), into a manifold and up into the microchannels. The level of liquid in the manifolds was controlled by use of a manometer. The fluid was then drained by gravity and a $N_2$ purge cleared remaining liquid from the microchannels. In this example, the thermally grown alumina layer was first treated with a La-containing solution, then an alumina sol, then La-containing solution, and finally a Pt-containing solution. The device was then cut into pieces for analysis. The coatings exhibited excellent adhesion with no flaking. Elemental analyses were conducted at 100×, 500× and 2000× magnifications using energy dispersive spectroscopy (EDS) at 20 kV excitation energy. Unless specified otherwise, this is the condition (at 100×, or if 100× is larger than the area available, then the largest available area for SEM) that should be used for elemental analysis of any coatings described herein (recognizing that some modifications may be required if such measurement conditions are impracticable for particular systems). As is well-known, this technique measures the surface composition, as well as some thickness below the surface.

Six channels (two sets of 3 channels) were analyzed. From each set of 3 channels there were 2 channels on an edge of the device and one in the middle. The coatings in the six channels were analyzed at the top and bottom (with respect to gravity during washcoating) of the coated section. The wt % Pt in each channel are shown below:

| Channel No. | 1 | 2 | 3 | 4 | 5 | 6 |
|---|---|---|---|---|---|---|
| top | 42 | 38 | 42 | 25 | 28 | 29 |
| bottom | 46 | 33 | 41 | 52 | 45 | 61 |

As can be seen, there was not a consistent trend in every microchannel. In the second set of microchannels (4, 5, 6) there appears to have been a problem with filling, draining, or both. The second set of channels contained about twice as much coating at the bottom of the channel than at the top. Perhaps, during the washcoating stage, the first set of channels drained efficiently, while the second set did not. There also appeared to be an effect in which the outer microchannels contained more coating, perhaps due to slower draining of these channels.

Heat Treatments

Figure 12:
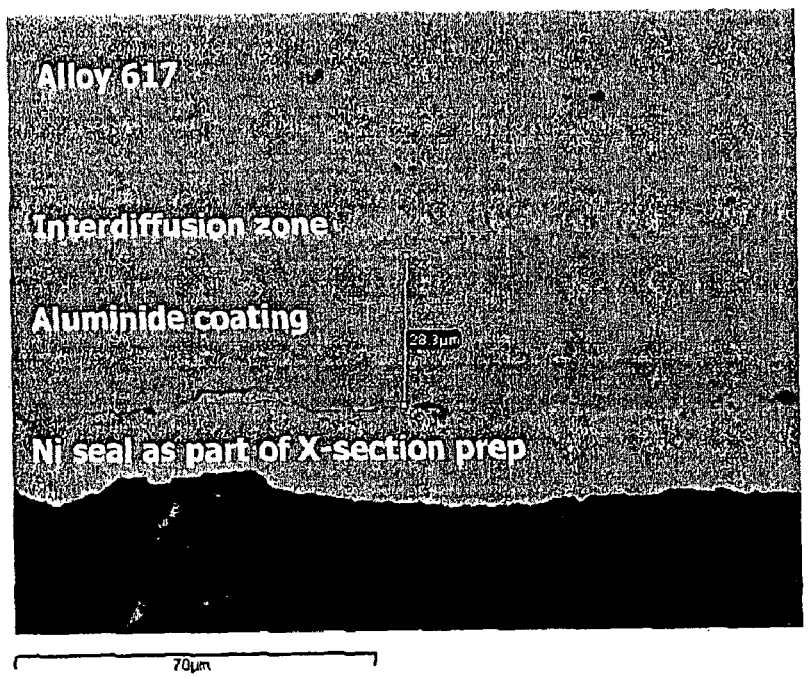
FIG. 12 shows a cross-sectional SEM micrograph of an aluminidized sample of Inconel™ 617.

Inconel™ 617 coupons were aluminidized and heat treated under a variety of conditions. A coupon aluminized to form the aluminide coating, but not oxidized, is shown in FIG. 12. The aluminide layer was about 30 μm thick and there was an interdiffusion zone between the aluminide layer and the alloy that was about 5 μm thick. The aluminide layer contained 28 to 31 wt % Al which corresponds to NiAl.

Heat treatment of an aluminidized coupon at 1100° C. for 100 hours caused the interdiffusion zone to essentially disappear and there was a substantial loss of aluminum from the aluminide layer into the alloy. Treatment of an aluminidized coupon at 1050° C. for 100 hours did not show loss of the aluminide coating.

Effect of Oxide Presence During Aluminidization Process

Figure 13:
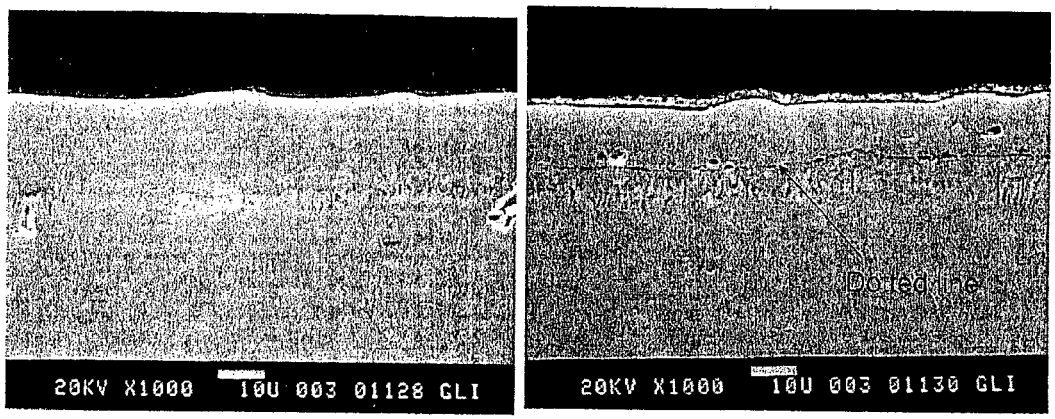
FIG. 13 shows a cross-sectional SEM micrograph of a coupon of Inconel™ 617 that was aluminidized (left), or exposed to air at 400° C. for one hour to grow some surface oxide prior to growing the aluminide layer.

FIG. 13 shows a comparison between a standard aluminidized coupon and a coupon heat treated in air at 400° C. for 1 hr to purposely grow some native oxide of chromia before being aluminized. A thin dotted line of inclusions in the aluminide is observed in the coupon with native oxide before aluminization. Such a line of inclusions could become a weak point in terms of adhesion. Reference to these figures should be taken when deciding whether an aluminide layer is substantially with or without oxide defects between an aluminide layer and a metal substrate.

Figure 14:
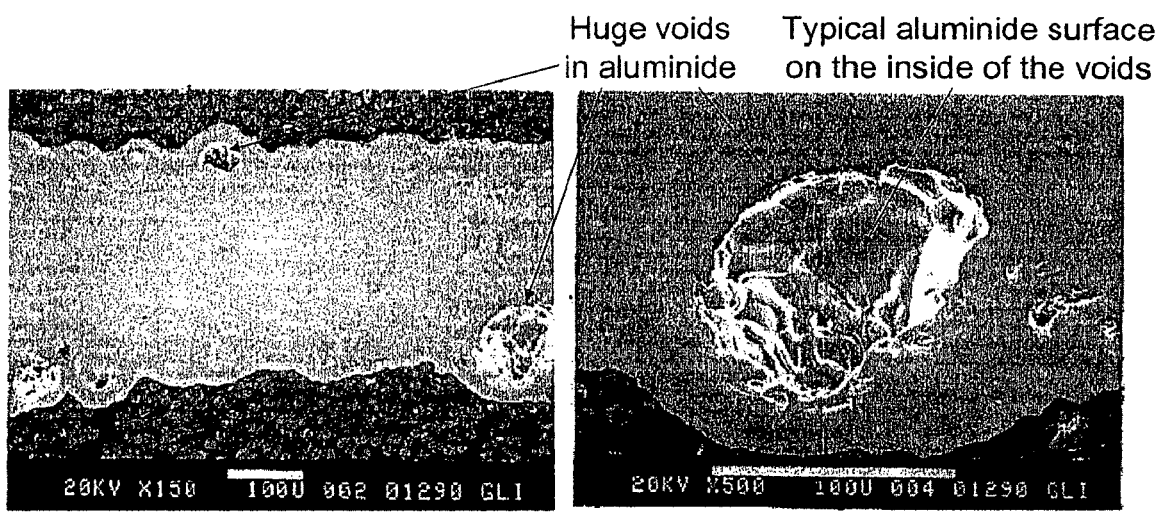
FIG. 14 shows a cross-sectional SEM micrograph of a coupon of Inconel™ 617 that was aluminidized in the presence of alumina disks.

Coating defects were also observed on FeCrAlY fins that were aluminidized in the presence of an alumina disk. FIG. 14 shows large voids in the aluminide layer of an Inconel™ 617 coupon that was aluminidized in the presence of an alumina disk.

In early attempts at the aluminidization of a multichannel device, it was discovered that the channels nearest the gas inlet (that is, the inlet for the aluminum compounds) showed the most inclusions while the channels furthest away showed the least. This is believed to have been caused by surface oxides in the tubing or manifolding in the pathway of the aluminum compounds prior to the microchannels. The presence of surface oxide in the tubing was confirmed by EDS. To avoid these defects, care should be taken to avoid the use components that have surface oxides in the aluminidization process, especially surface oxides along the fluid pathway (that is, the pathway carrying aluminum compounds) leading to a microchannel device. In some preferred techniques, the tubing and/or other fluid pathways are subjected to a treatment to remove surface oxides (brightened), such as by a hydrogen treatment, KOH etching, electro-polishing or micro-brushing. Of course, before aluminidization, the microchannels may also be subjected to a treatment for the removal of surface oxide.

In preferred embodiments, the aluminide layer and the interfaces of the aluminide layer with the alloy substrate and an oxide layer (if present) is preferably substantially without voids or inclusions that are larger than 10 μm, more preferably substantially without voids or inclusions that are larger than 3 μm. "Substantially without voids or inclusions" excludes coatings such as shown in FIG. 14 and other structures having numerous (that is, more than about 5 large or a single very large) defects in 50 μm of length along a channel, but wouldn't exclude a structure shown on the left of FIG. 13 that shows a small number of isolated defects.

We claim:

1. A method of conducting a chemical reaction in a reactor, the reactor comprising complex microchannels defined by at least one microchannel wall and a layer of aluminide disposed over the at least one microchannel wall,
wherein the complex microchannel comprises a rectangular cross-section and wherein the thickness of the coating at a corner of the rectangle is within 25% of the coating thickness measured at the midpoint between two corners of the rectangle; wherein the reactor further comprises a layer of alumina disposed over the layer of aluminide; and a catalytic material disposed over the layer of alumina, and further wherein the reactor comprises a manifold that is connected to at least two complex microchannels, wherein the manifold comprises a manifold wall that is coated with an aluminide layer;
the method comprising a step of passing a reactant into the complex microchannel and reacting the reactant in the complex microchannel to form at least one product.

2. The method of claim 1 wherein the complex microchannel is an interior microchannel that comprises one or more of the following characteristics: at least one contiguous microchannel having at least one angle of at least 45° with respect to itself, a length of 20 cm or more along with a height or width of 2 mm or less, at least one microchannel that splits into at least 2 sub-microchannels in parallel, one of at least 2 adjacent microchannels having an adjacent length of at least one cm that are connected by plural orifices along a common microchannel wall where the areas of the orifices amounts to 20% or less of the area of the microchannel wall in which the orifices are located and where each orifice is 1.0 mm$^2$ or smaller, and one of at least 5 parallel microchannels having a length of at least 1 cm and having openings to an internal manifold wherein the internal manifold comprises at least one dimension that is no more than three times the minimum height or width of the parallel microchannels.

3. The method of claim 1 wherein the manifold comprises features that tend to equalize flow through the at least two complex microchannels.

4. The method of claim 1 further comprising a heat transfer microchannel adjacent to at least one of the at least two complex microchannels wherein the heat transfer microchannel contains a heat exchange fluid; and further comprising a step of exchanging heat between the heat transfer microchannel and the at least one complex microchannel.

5. A method of conducting a chemical reaction in a microchannel reactor or separator, comprising:
a microchannel defined by at least one microchannel wall;
a post-assembly coating of aluminide disposed over the at least one microchannel wall,
a layer alumina disposed over the layer of aluminide; and
a catalytic material disposed over the layer of alumina, wherein the microchannel has a rectangular cross-section and wherein the thickness of the coating at a corner of the rectangle is within 25% of the coating thickness measured at the midpoint between two corners of the rectangle; the method comprising a step of passing a reactant into the complex microchannel and reacting the reactant in the microchannel to form at least one product.

6. The method of claim 5 wherein the microchannel is an interior microchannel that comprises one or more of the following characteristics: at least one contiguous microchannel having at least one angle of at least 45° with respect to itself, a length of 20 cm or more along with a height or width of 2 mm or less, at least one microchannel that splits into at least 2 sub-microchannels in parallel, one of at least 2 adjacent microchannels having an adjacent length of at least one cm that are connected by plural orifices along a common microchannel wall where the areas of the orifices amounts to 20% or less of the area of the microchannel wall in which the orifices are located and where each orifice is 1.0 mm² or smaller, and one of at least 5 parallel microchannels having a length of at least 1 cm and having openings to an internal manifold wherein the internal manifold comprises at least one dimension that is no more than three times the minimum height or width of the parallel microchannels.

7. A method of forming a catalyst, comprising:
providing an article comprising an aluminide surface;
adding a sintering aid to alumina to form an alumina layer with sintering aid disposed over the aluminide surface; and
heating the article with an alumina layer with sintering aid; and subsequently depositing a catalyst material.

8. The method of claim 7 wherein the sintering aid comprises at least one element selected from the group consisting of Na, Li, and B.

9. The method of claim 8 wherein the sintering aid comprises at least 0.5 weight percent of an element selected from the group consisting of Na, Li, and B.

10. The method of claim 8 wherein the alumina is a surface layer comprising alumina and the surface layer is then coated with a sintering aid solution prior to the step of heating.

11. A method of forming protected surfaces, comprising:
providing an article comprising an aluminide surface;
heating the article comprising an aluminide surface to at least about 800° C. in an inert or reducing atmosphere; and, subsequently,
exposing the aluminde surface to an oxidizing gas at a temperature of at least about 800° C. to grow an oxide layer.

12. The method of claim 11 comprising heating the article comprising an aluminide surface to at least about 1000° C. in an inert or reducing atmosphere; and, subsequently,
exposing the alumnde surface to an oxidizing gas at a temperature of at least about 1000° C. to grow an oxide layer.

13. The method of claim 11 comprising heating the article comprising an aluminide surface to at least about 900° C. in an inert or reducing atmosphere; and, subsequently,
exposing the aluminde surface to an oxidizing gas at a temperature of 1000 to 1100° C. to grow an oxide layer.

14. The method of claim 13 wherein the step of exposing the aluminde surface to an oxidizing gas is conducted at a temperature of 1025 to 1075° C.

15. The method of claim 11 wherein the step of exposing the aluminide surface to an oxidizing gas produces a thermally-grown oxide layer that is 1 μm thick or less.

16. A method of separating a mixture comprising at least two components in a separator, the separator comprising a complex microchannel defined by at least one microchannel wall and a layer of aluminide disposed over the at least one microchannel wall, wherein the complex microchannel comprises a rectangular cross-section and wherein the thickness of the coating at a corner of the rectangle is within 25% of the coating thickness measured at the midpoint between two corners of the rectangle; comprising:
a step of passing a fluid comprising at least two components into the complex microchannel, preferentially separating at least one of the at least two components within the complex microchannel.

17. The method of claim 16 wherein the step of preferentially separating at least one of the at least two components within the complex microchannel comprises adsorption, distillation, or reactive distillation.

* * * * *